United States Patent
Yamada

(10) Patent No.: US 9,529,051 B2
(45) Date of Patent: Dec. 27, 2016

(54) BATTERY SYSTEM, ELECTRIC VEHICLE, MOVABLE BODY, POWER STORAGE DEVICE, AND POWER SUPPLY DEVICE

(71) Applicant: SANYO Electric Co., Ltd., Osaka (JP)

(72) Inventor: Akihiko Yamada, Osaka (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 343 days.

(21) Appl. No.: 14/184,827

(22) Filed: Feb. 20, 2014

(65) Prior Publication Data
US 2014/0167656 A1    Jun. 19, 2014

Related U.S. Application Data

(63) Continuation of application No. PCT/JP2012/070951, filed on Aug. 20, 2012.

(30) Foreign Application Priority Data

Aug. 30, 2011  (JP) .................................. 2011-186966

(51) Int. Cl.
*G01R 31/36* (2006.01)
*H02J 7/00* (2006.01)

(52) U.S. Cl.
CPC ......... *G01R 31/362* (2013.01); *G01R 31/3624* (2013.01); *H02J 7/00* (2013.01); *G01R 31/3651* (2013.01)

(58) Field of Classification Search
CPC .............. G01R 31/362; G01R 31/3624; G01R 31/3651; H02J 7/00
See application file for complete search history.

(56) References Cited

U.S. PATENT DOCUMENTS

| | | | | |
|---|---|---|---|---|
| 5,394,089 A | * | 2/1995 | Clegg | G01R 31/3624 320/DIG. 21 |
| 5,525,890 A | * | 6/1996 | Iwatsu | G01R 31/3648 320/106 |
| 6,064,180 A | * | 5/2000 | Sullivan | B60L 11/1851 320/132 |

(Continued)

FOREIGN PATENT DOCUMENTS

| | | |
|---|---|---|
| JP | 2003303627 A | 10/2003 |
| JP | 2005201743 A | 7/2005 |

(Continued)

*Primary Examiner* — Shawki S Ismail
*Assistant Examiner* — Muhammad S Islam
(74) *Attorney, Agent, or Firm* — Cantor Colburn LLP

(57) ABSTRACT

Provided is a battery system capable of accurately calculating a state of charge of a battery cell, an electric vehicle, a movable structure, an electricity storage device, and a power supply device. A current-based SOC calculation unit calculates a current-based SOCi on the basis of current flowing in a battery cell. A voltage-based SOC calculation unit calculates a voltage-based SOCv on the basis of the terminal voltage of the battery cell. A combined SOC calculation unit calculates a combined SOCt by weighting the SOCi and the SOCv with the respective weight coefficients (1−α) and α, and combining the weighted SOCi and SOCv. The weight coefficients (1−α) and α are determined based on whether the battery cell is in a charging state, a discharging state, or a charge/discharge stopped state.

9 Claims, 16 Drawing Sheets

(56) References Cited

U.S. PATENT DOCUMENTS

| | | | |
|---|---|---|---|
| 6,229,285 B1 * | 5/2001 | Ding | H01M 10/44 320/132 |
| 6,549,014 B1 * | 4/2003 | Kutkut | G01R 1/203 320/132 |
| 2003/0195719 A1 | 10/2003 | Emori et al. | |
| 2005/0119856 A1 | 6/2005 | Emori et al. | |
| 2005/0154544 A1 * | 7/2005 | Ono | G01R 31/361 702/63 |
| 2006/0247871 A1 | 11/2006 | Emori et al. | |
| 2006/0276981 A1 * | 12/2006 | Aridome | G01R 31/3648 702/64 |
| 2007/0236181 A1 * | 10/2007 | Palladino | H01M 10/486 320/130 |
| 2009/0103341 A1 * | 4/2009 | Lee | H02J 7/022 363/124 |
| 2009/0271132 A1 * | 10/2009 | Furukawa | G01R 31/362 702/63 |
| 2010/0036626 A1 * | 2/2010 | Kang | G01R 31/3679 702/63 |
| 2011/0279094 A1 * | 11/2011 | Nakatsuji | G01R 31/3651 320/162 |

FOREIGN PATENT DOCUMENTS

| | | |
|---|---|---|
| JP | 2006038494 A | 2/2006 |
| JP | 2008145349 A | 6/2008 |

\* cited by examiner (a)

(b)

(c)

(a)

(b)

(c)

(a)

(b)

BATTERY SYSTEM, ELECTRIC VEHICLE, MOVABLE BODY, POWER STORAGE DEVICE, AND POWER SUPPLY DEVICE

CROSS-REFERENCE TO RELATED APPLICATIONS

The present application is a continuation under 35 U.S.C. §120 of PCT/JP2012/070951, filed Aug. 20, 2012, which is incorporated herein by reference and which claimed priority to Japanese Patent Application No. 2011-186966 filed on Aug. 30, 2011. The present application likewise claims priority under 35 U.S.C. §119 to Japanese Patent Application No. 2011-186966 filed on Aug. 30, 2011, the entire content of which is also incorporated herein by reference.

BACKGROUND

Technical Field

The present invention relates to a battery system, and an electric vehicle, a movable structure, an electricity storage device, and a power supply device having the battery system.

Related Art

For a movable structure such as an electricity-driven vehicle or a power supply device storing electricity, a battery system including a battery cell which can be charged and discharged is used. Such a battery system is equipped with a device for evaluating the state of charge such as a remaining capacity of the battery cell (for example, refer to JP 2005-201743 A).

In a remaining capacity calculation device for an electricity accumulating device described in JP 2005-201743 A, a remaining capacity determined by integrating the current and a remaining capacity determined based on an estimated value of a battery open circuit voltage are weighted with weights that are constantly changed based on a current change rate, and the weighted values are combined, to determine a final remaining capacity.

The remaining capacity determined based on the integration of the current and the remaining capacity determined based on the battery open circuit voltage have respective advantages and disadvantages. However, in the remaining capacity calculation device of JP 2005-201743 A, the weights are determined based on the current change rate. Because of this, in a case where an instantaneous change of the current occurs frequently, the calculated remaining capacity would discontinuously change. Because of this, in the remaining capacity calculation device for electricity accumulating device of JP 2005-201743 A, the remaining capacity cannot be obtained with a high precision.

An advantage of the present invention is in the provision of a battery system, an electric vehicle, a movable structure, an electricity storage device, and a power supply device in which the state of charge of a battery cell can be precisely calculated.

SUMMARY

According to one aspect of the present invention, there is provided a battery system comprising: a battery cell; and a state-of-charge calculation unit that calculates a state of charge of the battery cell, wherein the state-of-charge calculation unit comprises: a first state-of-charge calculation unit that calculates a state of charge of the battery cell based on a current flowing in the battery cell as a first state of charge; a second state-of-charge calculation unit that calculates a state of charge of the battery cell based on a terminal voltage of the battery cell as a second state of charge; and a combining unit that weights the first state of charge calculated by the first state-of-charge calculation unit and the second state of charge calculated by the second state-of-charge calculation unit with a first weight coefficient and a second weight coefficient, respectively, and that combines the weighted first state of charge and the weighted second state of charge to calculate a combined state of charge, and the combining unit determines the first weight coefficient and the second weight coefficient based on whether the battery cell is in a charging state, a discharging state, or a charge/discharge stopped state.

Advantageous Effects

According to various aspects of the present invention, the state of charge of the battery cell can be precisely calculated.

DETAILED DESCRIPTION

[1] First Preferred Embodiment

A battery system according to a first preferred embodiment of the present invention will now be described with reference to the drawings. A battery system is equipped on a movable structure having electric power as a drive source such as an electric vehicle, on a power supply device having an electricity storage device, or the like. The battery system may alternatively be equipped on a consumer appliance having a battery cell which can be charged and discharged.

(1) Structure of Battery System

Figure 1:
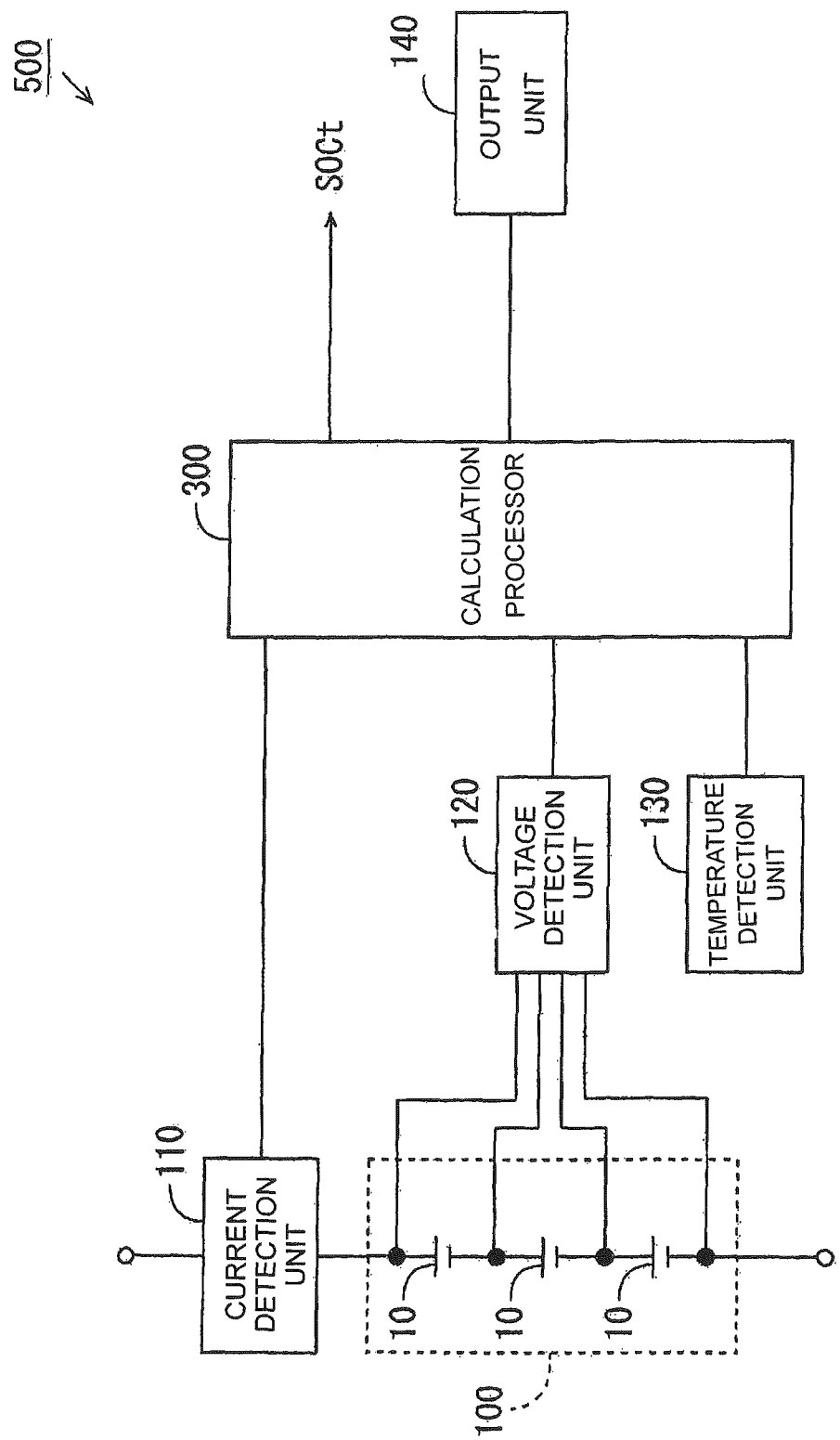
FIG. 1 is a block diagram showing a structure of a battery system according to a first preferred embodiment of the present invention.

FIG. 1 is a block diagram showing a structure of a battery system 500 according to the first preferred embodiment of the present invention. The battery system 500 comprises a battery module 100, a current detection unit 110, a voltage detection unit 120, a temperature detection unit 130, an output unit 140, and a calculation processor 300.

The battery module 100 includes a plurality of battery cells 10. The plurality of battery cells 10 are connected in series in the battery module 100. Each battery cell 10 is a secondary battery. In the present embodiment, a lithium ion battery is used as the secondary battery.

The current detection unit 110 is formed, for example, with a shunt resistor, a differential amplifier, and an A/D (analog-to-digital) converter. Alternatively, a current sensor may be used as the current detection unit 110. The current detection unit 110 is connected in series to the battery module 100. The current detection unit 110 detects a current flowing in the plurality of battery cells 10, and supplies the detected value of the current to the calculation processor 300.

The voltage detection unit 120 is connected to a positive electrode terminal and a negative electrode terminal of each battery cell 10. The voltage detection unit 120 detects a terminal voltage of each battery cell 10, and supplies the detected value of the terminal voltage to the calculation processor 300.

The temperature detection unit 130 detects a temperature of the battery module 100 and supplies the detected value of the temperature to the calculation processor 300. The temperature detection unit 130 includes, for example, a plurality of thermistors. As the temperature of the battery cell 10, for example, a surface temperature of the battery cell 10 is detected. In this case, the thermistors may be mounted on all of the battery cells 10 or the thermistors may be mounted on a part of the battery cells 10. In the case where the thermistors are only mounted on a part of the battery cells 10, for example, the temperatures of the other battery cells 10 are deduced based on the temperatures of the part of the battery cells 10. The temperatures detected by the thermistor are used for the temperatures of the part of the battery cells 10, and the deduced temperatures are used for the temperatures of the other battery cells 10.

The calculation processor 300 is formed with, for example, a CPU (central processing unit) and a memory, or a microcomputer. The calculation processor 300 calculates an open circuit voltage (OCV) of each battery cell 10 based on the value of the current detected by the current detection unit 110, the value of the terminal voltage of each battery cell 10 detected by the voltage detection unit 120, and the value of the internal resistance of the battery cell 10. A graph showing a relationship between the temperature of the battery cell 10 and the internal resistance of the battery cell 10 is stored in the memory of the calculation processor 300. In addition, the calculation processor 300 calculates a state of charge of each battery cell 10. In other words, the calculation processor 300 has a function as a state-of-charge calculation unit or a state-of-charge calculation device that calculates a state of charge of the battery cell 10.

In the following description, an amount of charge accumulated in each battery cell 10 in a fully charged state will be called a fully charged capacity. An amount of charge accumulated in each battery cell 10 in an arbitrary state will be called a remaining capacity. A ratio of the remaining capacity with respect to the fully charged capacity of each battery cell will be called charge percentage (SOC). In the present embodiment, as an example of the state of charge of each battery cell 10, the SOC of each battery cell 10 is calculated. The state of charge includes, other than the SOC, an open circuit voltage, a remaining capacity, a depth of discharge, a current integrated value, and an accumulated amount difference. The remaining capacity is a ratio of SOC with respect to the fully charged capacity of the battery cell 10. The depth of discharge is a ratio of the chargeable capacity (capacity obtained by subtracting the remaining capacity from the fully charged capacity of the battery cell 10) with respect to the fully charged capacity. The current integrated value is an integrated value of current flowing in the battery cell 10. The accumulated amount difference is a difference between the SOC of the battery cell 10 and a predetermined reference SOC (for example, 50%).

The calculation processor 300 calculates the SOC of each battery cell 10 based on the value of the current detected by the current detection unit 110. The SOC calculated based on the integrated value of the current detected by the current detection unit 110 will hereinafter be called a current-based SOCi. The SOCi is calculated by the following Equation (1). The calculated SOCi is stored in a memory of the calculation processor 300 (a storage unit 340 of FIG. 3 to be described later).

$$SOCi = (\text{integrated amount of charging current [Ah]} - \text{integrated amount of discharging current [Ah]}) / \text{fully charged capacity [Ah]} \times 100 \, [\%] \quad (1)$$

In Equation (1), the integrated amount of charging current refers to an integrated value of the current detected by the current detection unit 110 during charging of the battery cell 10. The integrated amount of discharging current refers to an integrated value of the current detected by the current detection unit 110 during discharging of the battery cell 10.

Figure 2:
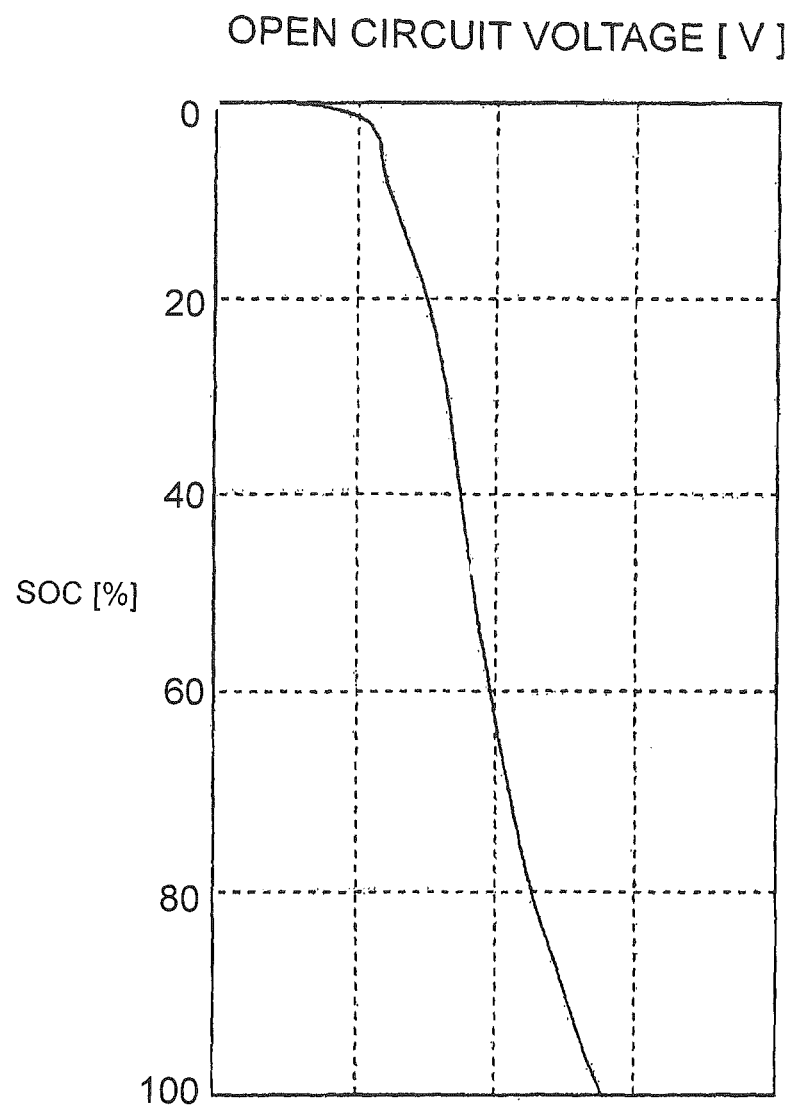
FIG. 2 is a diagram showing a relationship between an open circuit voltage and an SOC of a battery cell.

The calculation processor 300 also calculates the SOC of each battery cell 10 based on an open circuit voltage of each battery cell 10. The SOC calculated based on the open circuit voltage of each battery cell 10 will hereinafter be referred to as a voltage-based SOCv. FIG. 2 is a diagram showing a relationship between the open circuit voltage of the battery cell 10 and the SOC. A graph showing the relationship between the open circuit voltage and the SOC is stored in the storage unit 340 of the calculation processor 300. The SOCv is calculated based on the relationship between the open circuit voltage and the SOC stored in the storage unit 340 of the calculation processor 300. During the time when the charging or discharging of the battery cell 10 is stopped, the terminal voltage of the battery cell 10 is the open circuit voltage. A method of calculating the open circuit voltage of the battery cell 10 during charging or discharging of the battery cell 10 will be described later in section "(2) Detailed Structure of Calculation Processor". The calculated SOCv is stored in the storage unit 340 of the calculation processor 300.

The current-based SOCi and the voltage-based SOCv have respective advantages. The SOCi can be precisely calculated even when a change of the current flowing in the battery cell 10 is large. However, when there is an error in the current detected by the current detection unit 110, as the time elapses, an error in the calculated value of the SOCi becomes significant and thus, cannot be ignored. Also, in the case where the quantization error in the A/D converter included in the current detection unit 110 is large or an error due to the performance of the A/D converter is large, as the time elapses, the error in the calculated value of the SOCi becomes significant and thus, cannot be ignored.

On the other hand, the SOCv can be precisely obtained at a steady state after a certain amount of time (transition period) has elapsed from the time of stopping of charging or discharging. However, during the transition period, the terminal voltage of the battery cell 10, and, consequently, the open circuit voltage, is unstable, and an error is caused in the calculated value of the SOCv.

In consideration of these, the calculation processor 300 suitably selects the SOC having a smaller error between the SOCi and the SOCv, to calculate an accurate SOC. In the following, an SOC obtained by weighting the SOCi and the SOCv and combining the weighted SOCi and the weighted SOCv will be called a combined SOCt. The combined SOCt is calculated based on the following Equation (2). In Equation (2), $\alpha$ is a weight coefficient. The calculated combined SOCt is stored in the storage unit 340 of the calculation processor 300. In the present embodiment, an example configuration is described in which a weight coefficient $(1-\alpha)$ is set as an example of a first weight coefficient and a weight coefficient $\alpha$ is set as an example of a second weight coefficient. In the present embodiment, a sum of the first and second weight coefficients is set to 1, but the present invention is not limited to such a configuration, and the sum of the first and second weight coefficient may be a number other than 1.

$$SOCt=(1-\alpha)\times SOCi+\alpha\times SOCv[\%]\text{-} \qquad (2)$$

The output unit 140 includes, for example, a liquid crystal display panel, a plasma display panel, an organic EL (electroluminescence) panel, or other monitor devices. The output unit 140 outputs as a display of text or the like the combined SOCt calculated by the calculation processor 300, and the weight coefficients $\alpha$ and $(1-\alpha)$. With this configuration, during maintenance of the battery system 500, a worker can easily understand the state of charge of the battery cell 10. In addition, the user of the battery system 500 can easily understand the state of charge of the battery cell 10.

The output unit 140 may alternatively be a speaker which outputs the combined SOCt and the weight coefficients $\alpha$ and $(1-\alpha)$ as a voice, or an output circuit which outputs the combined SOCt, and the weight coefficients $\alpha$ and $(1-\alpha)$ as electric signals. The output unit 140 may alternatively output a text, an image, or a voice indicating the usage method or various instructions for the battery system 500. When an abnormality occurs in the battery system 500, the output unit 140 may output a text, an image, or a voice indicating alert.

(2) Detailed Structure of Calculation Processor

Figure 3:
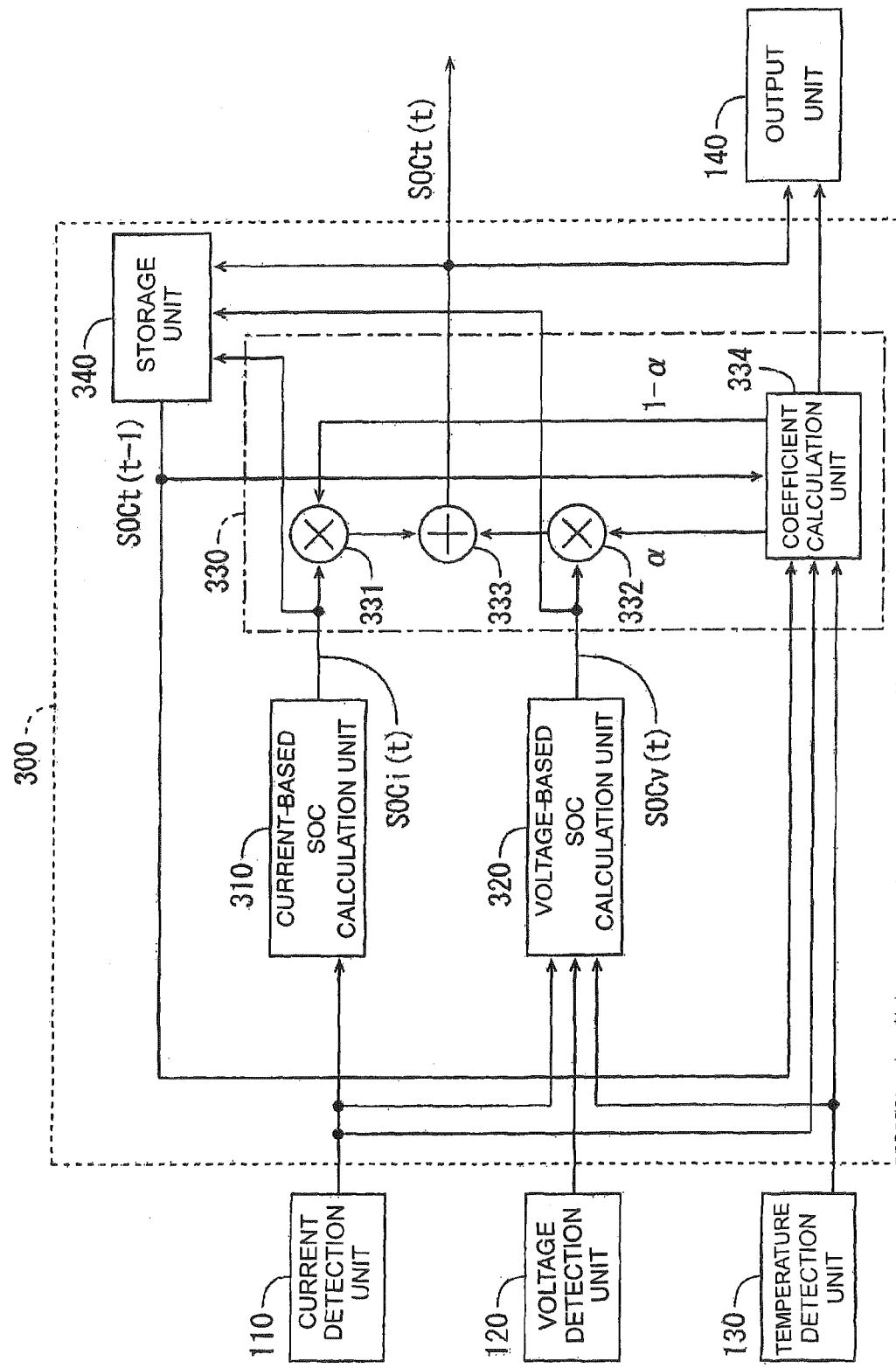
FIG. 3 is a block diagram showing a detailed structure of a calculation processor.

FIG. 3 is a block diagram showing a detailed structure of the calculation processor 300. As shown in FIG. 3, the calculation processor 300 comprises a current-based SOC calculation unit 310, a voltage-based SOC calculation unit 320, a combined SOC calculation unit 330, and the storage unit 340.

Functions of the current-based SOC calculation unit 310, the voltage-based SOC calculation unit 320, and the combined SOC calculation unit 330 are realized, for example, by hardware such as a CPU and a memory, and software such as a computer program. The current-based SOC calculation unit 310, the voltage-based SOC calculation unit 320, and the combined SOC calculation unit 330 correspond to, for example, modules of a computer program. The storage unit 340 is, for example, a memory.

The current-based SOC calculation unit 310 calculates SOCi(t) at a time t based on the current detected by the current detection unit 110. The calculated SOCi(t) is stored in the storage unit 340.

The voltage-based SOC calculation unit 320 calculate the open circuit voltage of each battery cell 10 based on the current detected by the current detection unit 110, the voltage detected by the voltage detection unit 120, and the temperature detected by the temperature detection unit 130, during charging and discharging of the battery cell 10. The open circuit voltage OCV of each battery cell 10 is calculated by the following Equation (3).

$$OCV=E-r\times I\text{-} \qquad (3)$$

In the above-described Equation (3), E is a terminal voltage of the battery cell 10, which is detected by the voltage detection unit 120, I is the current flowing in the battery cell 10, which is detected by the current detection unit 110, and r is an internal resistance of the battery cell 10. During the time when the battery cell 10 is charged, the current I flowing in the battery cell 10 is positive, and, during the time when the battery cell 10 is discharged, the current I flowing in the battery cell 10 is negative.

The value of the internal resistance r of the battery cell 10 differs depending on the temperature of the battery cell 10. The storage unit 340 of the calculation processor 300 stores a graph showing a relationship between the temperature of the battery cell 10 and the internal resistance of the battery cell 10. The voltage-based SOC calculation unit 320 obtains a value of the internal resistance corresponding to the temperature detected by the temperature detection unit 130 from the graph as the value of the internal resistance r.

That is, the calculation processor 300 can obtain the internal resistance r of the battery cell 10 by detecting the temperature of the battery cell 10. In this manner, the voltage-based SOC calculation unit 320 calculates the open circuit voltage of the battery cell 10 based on the current detected by the current detection unit 110 (current I flowing in the battery cell 10), the voltage detected by the voltage detection unit 120 (terminal voltage E of the battery cell 10), and the temperature detected by the temperature detection unit 130, using the above-described Equation (3). As described above, during the time when the charging or discharging of the battery cell 10 is stopped, the terminal voltage of the battery cell 10 is equal to the open circuit voltage.

In addition, the voltage-based SOC calculation unit 320 obtains the SOCv(t) at a time t from the graph of FIG. 2 based on the open circuit voltage of each battery cell 10 calculated using the above-described Equation (3). The obtained SOCv(t) is stored in the storage unit 340.

The combined SOC calculation unit 330 comprises multipliers 331 and 332, an adder 333, and a coefficient calculation unit 334. The coefficient calculation unit 334 determines the coefficients $\alpha$ and $(1-\alpha)$ based on at least one of the current detected by the current detection unit 110, the temperature detected by the temperature detection unit 130, and the combined SOCt (t-1) at a time (t-1) (combined SOCt calculated at a time (t-1) which is a previous time before the time t).

The SOCi(t) calculated by the current-based SOC calculation unit 310 and the weight coefficient $(1-\alpha)$ determined by the coefficient calculation unit 334 are multiplied together by the multiplier 331, to calculate a weighted SOCi(t) $(=(1-\alpha)\times SOCi(t))$. Similarly, the SOCv(t) calculated by the voltage-based SOC calculation unit 320 and the weight coefficient $\alpha$ determined by the coefficient calculation unit 334 are multiplied together by the multiplier 332, to calculate a weighted SOCv(t) $(=\alpha\times SOCv(t))$. The weighted SOCi(t) calculated by the multiplier 331 and the weighted SOCv(t) calculated by the multiplier 332 are added, to calculate a combined SOCt(t) at the time t.

The combined SOCt(t) calculated by the adder 333 is stored in the storage unit 340. The combined SOCt(t) calculated by the adder 333 is also supplied to a primary controller 607 of an electricity-driven automobile 600 of FIG. 16 to be described later or to a system controller 712 of a power supply device 700 of FIG. 17 to be described later. The combined SOCt calculated by the adder 333 and the weight coefficients $\alpha$ and $(1-\alpha)$ determined by the coefficient calculation unit 334 are output by the output unit 140.

As described, in the battery system 500 of the present embodiment, the current-based SOC calculation unit 310 calculates the SOC of the battery cell 10 based on the current flowing in the battery cell 10 as the SOCi. In addition, the voltage-based SOC calculation unit 320 calculates the SOC of the battery cell 10 based on the terminal voltage of the battery cell 10 as the SOCv. The SOCi and the SOCv are respectively weighted with weight coefficients $\alpha$ and $(1-\alpha)$, and the combined SOC calculation unit 330 combines the weighted SOCi and the weighted SOCv, to calculate the combined SOCt.

Precision of the calculated SOCi and precision of the calculated SOCv vary depending on whether the battery cell 10 is in the charging state, in the discharging state, or in the charge/discharge stopped state. Therefore, the weight coefficients $\alpha$ and $(1-\alpha)$ are determined based on whether the battery cell 10 is in the charging state, in the discharging state, or in the charge/discharge stopped state. With such a configuration, the calculation processor 300 can precisely calculate the SOC of the battery cell 10 as the combined SOCt.

(3) Summary of Changes with Respect to Time of Operation State of Battery Cell 10 and SOC The precision of the SOCi calculated by the current-based SOC calculation unit 310 and the precision of the SOCv calculated by the voltage-based SOC calculation unit 320 vary depending on the temperature of the battery cell 10, the current flowing in the battery cell 10, or the SOC of the battery cell 10. In consideration of this, the calculation processor 300 sets suitable weight coefficients $\alpha$ and $(1-\alpha)$ in the following manner based on at least one of the current detected by the current detection unit 110, the temperature detected by the temperature detection unit 130, and the combined SOCt of the battery cell 10 stored in the storage unit 340, during the time when the battery cell 10 is being charged or discharged. With such a configuration, the SOC of the battery cell 10 can be precisely calculated.

Figure 4:
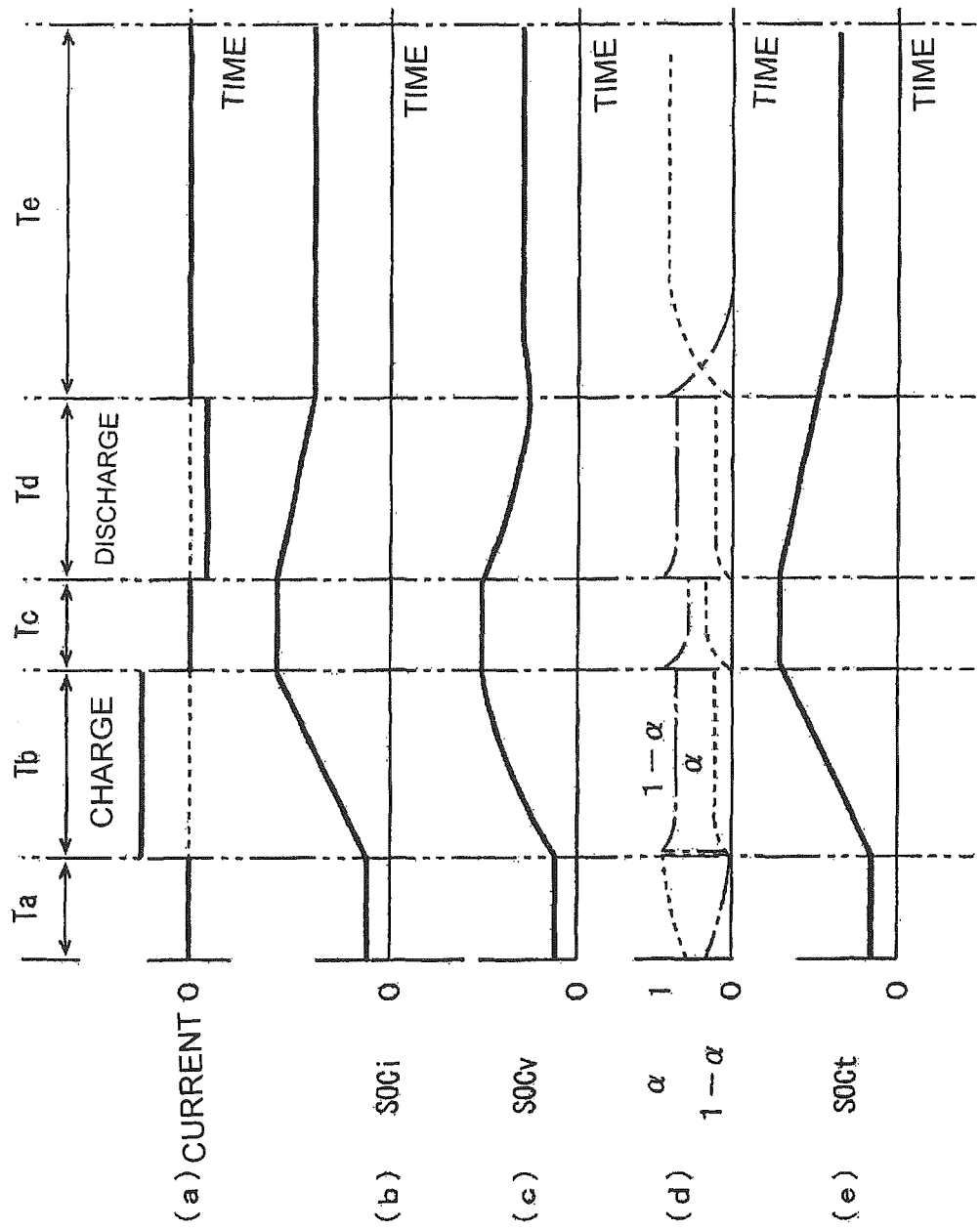
FIG. 4 is a diagram showing an example of a summary of changes with respect to time of an operation state and an SOC of a battery cell.

FIG. 4 is a diagram showing an example summary of changes with respect to time of an operation state of the battery cell 10 and the SOC. In FIGS. 4(a)-4(e), the horizontal axis represents time. In FIG. 4(a), the vertical axis represents the current detected by the current detection unit 110. The current during charging is represented with a positive value and the current during the discharging is represented with a negative value. In FIG. 4(b), the vertical axis represents SOCi. In FIG. 4(c), the vertical axis represents the SOCv. In FIG. 4(d), the vertical axis represents the weight coefficient $\alpha$ and the weight coefficient $(1-\alpha)$, with a dot line and a dot-and-chain line respectively representing the weight coefficients $\alpha$ and $(1-\alpha)$. In FIG. 4(e), the vertical axis represents the combined SOCt. In the example of FIG. 4, in the setting of the weight coefficient $\alpha$ and the weight coefficient $(1-\alpha)$, the temperature of the battery cell 10 and the combined SOCt stored in the storage unit 340 are not taken into consideration. A method of setting the weight coefficients $\alpha$ and $(1-\alpha)$ taking into consideration the temperature of the battery cell 10 and the combined SOCt stored in the storage unit 340 will be described later in sections "(4-2) Second Setting Example of Weight Coefficients" and "(4-3) Third Setting Example of Weight Coefficients".

In FIGS. 4(a)-4(e), in periods Ta, Tc, and Te, the plurality of battery cells 10 are not charged or discharged. In this case, as shown in FIG. 4(a), no current flows in the plurality of battery cells 10. Therefore, as shown in FIGS. 4(b) and 4(c), the SOCi and the SOCv are approximately constants. In the periods Ta, Tc, and Te, because the current flowing in the battery cell 10 is 0, as shown by the above-described Equation (3), the open circuit voltage and the terminal voltage of the battery cell 10 are equal to each other. In this case, the voltage-based SOC calculation unit 320 can obtain the SOCv from the terminal voltage of the battery cell 10 based on the graph showing the relationship of FIG. 2.

As shown in FIG. 4(d), the weight coefficient $\alpha$ is set to increase as time elapses, and the weight coefficient $(1-\alpha)$ is set to decrease as time elapses. In this case, as the weighted SOCi $(=(1-\alpha)\times SOCi)$ decreases, the weighted SOCv $(=\alpha\times SOCv)$ increases. As shown in the above-described Equation (2), the combined SOCt is a sum of the weighted SOCi $(=(1-\alpha)\times SOCi)$ and the weighted SOCv $(=\alpha\times SOCv)$. Thus, the percentage of SOCv in the combined SOCt increases as time elapses. In addition, because the weighted SOVc increases with the decrease of the weighted SOCi, the combined SOCt is approximately constant, as shown in FIG. 4(e).

In FIGS. 4(a)-4(e), in the period Tb, the plurality of battery cells 10 are charged. In this case, as shown in FIG. 4(a), a positive current flows in the plurality of battery cells 10. Therefore, as shown in FIG. 4(b), the SOCi increases as time elapses. Because the terminal voltage (open circuit voltage) of the battery cell 10 increases with the charging, as shown in FIG. 4(c), the SOCv also increases as time elapses. In the period Tb, because the current flowing in the battery cell 10 is not 0, based on the above-described Equation (3), the terminal voltage and the open circuit voltage of the battery cell 10 are not equal to each other. More specifically, because a positive current flows in the battery cell 10, based on the above-described Equation (3), the open circuit voltage of the battery cell 10 is lower than the terminal voltage by the voltage drop due to the internal resistance of the battery cell 10. In this case, the voltage-based SOC calculation unit 320 can obtain the internal resistance based on the temperature of the battery cell 10, can calculate the open circuit voltage of the battery cell 10 based on the terminal voltage of the battery cell 10, the current flowing in the battery cell 10, and the internal resistance through the Equation (3), and can obtain the SOCv from the calculated open circuit voltage based on the graph showing the relationship of FIG. 2.

As shown in FIG. 4(d), the weight coefficients α and (1−α) are set constant except for the transition period. Here, the transition period refers to a period of a state of transition after the charging or discharging is started or after the charging or discharging is stopped, where the open circuit voltage of the battery cell is unstable. A steady state refers to a state where the open circuit voltage of the battery cell 10 is stable. In the example configuration of FIG. 4(d), the weight coefficient α is smaller than the weight coefficient (1−α). Because of this, the weighted SOCi is larger than the weighted SOCv. As shown in the above-described Equation (2), the combined SOCt is a sum of the weighted SOCi and the weighted SOCv. Therefore, the percentage of the SOCi in the combined SOCt is large.

As shown in FIG. 4(e), the combined SOCt increases as time elapses. A reason for this is because the combined SOCt is the sum of the weighted SOCi and the weighted SOCv as shown in the above-described Equation (2), and the SOCi and the SOCv increase as time elapses, as shown in FIGS. 4(b) and 4(c).

In FIGS. 4(a)-4(e), in the period Td, the plurality of battery cells 10 are discharged. In this case, as shown in FIG. 4(a), a negative current flows in the plurality of battery cells 10. In addition, as shown in FIG. 4(b), the SOCi decreases as time elapses. In addition, because the terminal voltage (open circuit voltage) of the battery cell 10 decreases with the discharging, the SOCv also decreases as time elapses, as shown in FIG. 4(c). In the period Td, because the current flowing in the battery cell 10 is not 0, based on the above-described Equation (3), the terminal voltage and the open circuit voltage of the battery cell 10 are not equal to each other. More specifically, because a negative current flows in the battery cell 10, based on the above-described Equation (3), the open circuit voltage of the battery cell 10 is higher than the terminal voltage by the voltage drop due to the internal resistance of the battery cell 10. In this case, the voltage-based SOC calculation unit 320 can obtain the internal resistance based on the temperature of the battery cell 10, can calculate the open circuit voltage of the battery cell 10 based on the terminal voltage of the battery cell 10, the current flowing in the battery cell 10, and the internal resistance through the above-described Equation (3), and obtain the SOCv from the calculated open circuit voltage based on the graph showing the relationship of FIG. 2.

As shown in FIG. 4(d), the weight coefficients α and (1−α) are set constant except for the transition period. In the example configuration of FIG. 4(d), the weight coefficient α is smaller than the weight coefficient (1−α). Because of this, the weighted SOCi becomes larger than the weighted SOCv. As shown in the above-described Equation (2), the combined SOCt is the sum of the weighted SOCi and the weighted SOCv. Therefore, the percentage of the SOCi in the combined SOCt is larger.

As shown in FIG. 4(e), the combined SOCt decreases as time elapses. This is because, as shown in the above-described Equation (2), the combined SOCt is the sum of the weighted SOCi and the weighted SOCv, and the SOCi and the SOCv decrease as time elapses, as shown in FIGS. 4(b) and 4(c).

At the time of switching between charging, discharging, and charge/discharge stopped states, the calculated SOCi or the calculated SOCv tends to be unstable. In consideration of this, the combined SOC calculation unit 330 continuously varies the weight coefficients α and (1−α) at the time of switching between the charging, discharging, and charge/discharge stopped states toward the set value as time elapses. With such a configuration, the calculation processor 300 can inhibit discontinuous change of the calculated combined SOCt even when the SOCi or the SOCv of the battery cell 10 is not stable at the time of switching among the charging, discharging, and charge/discharge stopped states. As a result, the SOC of the battery cell 10 can be precisely calculated.

(4) Detailed Setting Example of Weight Coefficients

In the following, a detailed method of setting the weight coefficient α during the transition period, which has not been described in the example summary of the changes with respect to time of the operation state of the battery cell 10 and the SOC of FIG. 4, will be described.

(4-1) First Setting Example of Weight Coefficients

In the above-described example configuration of FIG. 4, the temperature of the battery cell 10 is not taken into consideration in the setting of the weight coefficients α and (1−α). In the following, a setting example of the weight coefficient α during charging or discharging (periods Tb and Td in FIG. 4) taking into consideration the temperature detected by the temperature detection unit 130 will be described.

Figure 5:
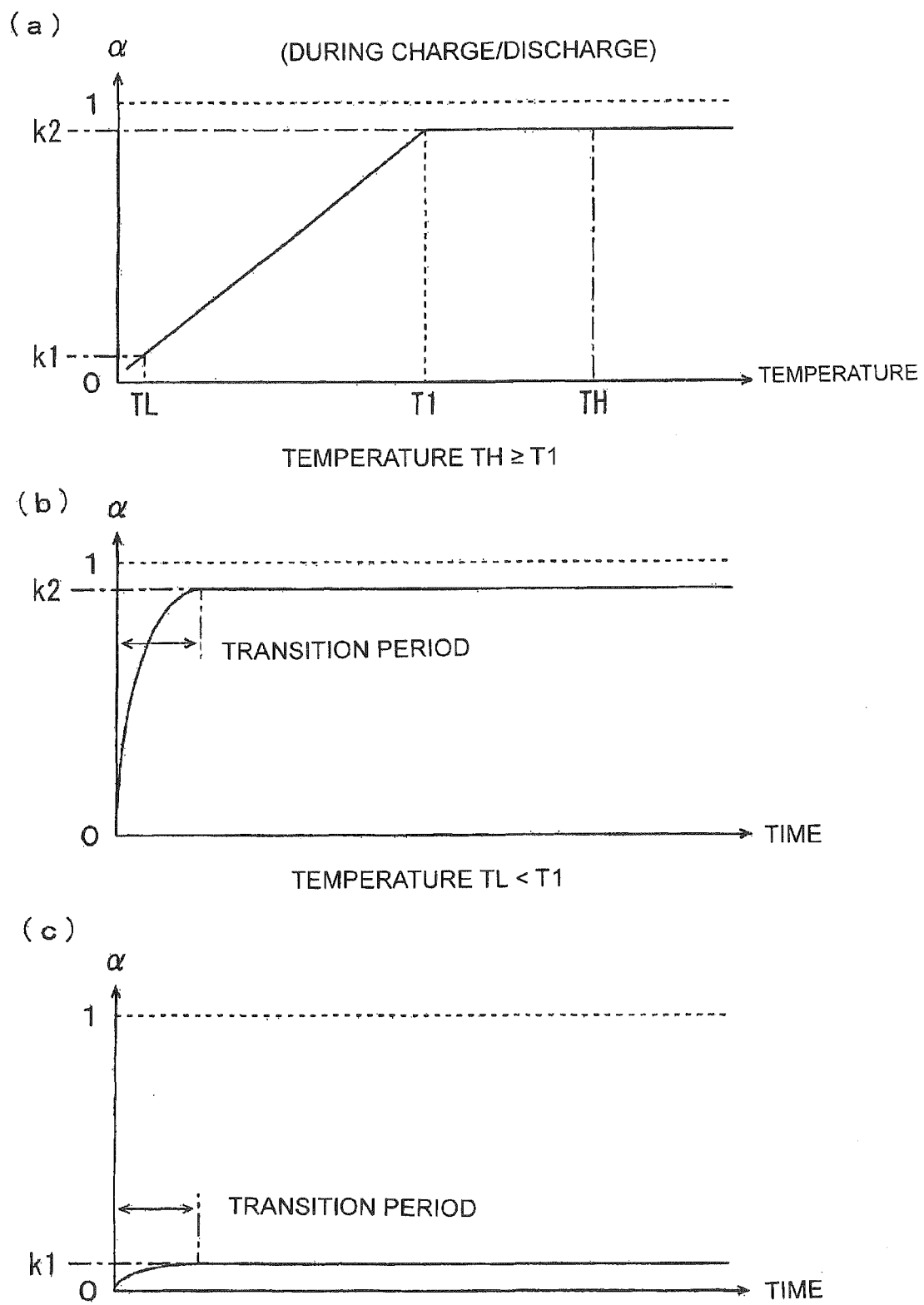
FIG. 5 is a diagram showing a relationship among a temperature detected by a temperature detection unit during charging/discharging, an elapsed time from start of charging/discharging, and a weight coefficient.

FIG. 5 is a diagram showing a relationship among the temperature detected by the temperature detection unit 130 during charging/discharging, elapsed time from the start of charging/discharging, and the weight coefficient α. In FIG. 5(a), the horizontal axis represents the temperature detected by the temperature detection unit 130, and the vertical axis represents the weight coefficient α. In FIGS. 5(b) and 5(c), the horizontal axis represents time and the vertical axis represents the weight coefficient α.

FIG. 5(a) shows a relationship between the temperature detected by the temperature detection unit 130 and the weight coefficient α. FIG. 5(b) shows a relationship between the elapsed time from the start of charging/discharging and the weight coefficient α in the case where the temperature detected by the temperature detection unit 130 is TH which is greater than or equal to a temperature threshold T1 which is set in advance. FIG. 5(c) shows a relationship between the elapsed time from the start of charging/discharging and the weight coefficient α in the case where the temperature detected by the temperature detection unit 130 is TL which is lower than the temperature threshold T1. In the present embodiment, the temperature threshold T1 is normal temperature, and is, for example, 10° C. to 20° C.

As the temperature of the battery cell 10 becomes higher, the internal resistance of the battery cell 10 becomes lower. In this case, because the error in the open circuit voltage calculated using the above-described Equation (3) based on the terminal voltage of the battery cell 10 is small, the SOCv can be precisely obtained. Therefore, as shown in FIG. 5(a), in the case where the temperature detected by the temperature detection unit 130 is lower than the temperature threshold T1, the weight coefficient α is set to increase as the temperature increases. The weight coefficient α when the temperature detected by the temperature detection unit 130 is TL is a value k1. In the case where the temperature detected by the temperature detection unit 130 is greater than or equal to the temperature threshold T1, the weight coefficient α is set to be constant at a relatively high value k2(for example, 0.9). That is, when the temperature detected by the temperature detection unit 130 is TH, the weight coefficient α is k2. With such a configuration, when the temperature detected by the temperature detection unit 130 is greater than or equal to the temperature threshold T1, the percentage of the SOCv in the combined SOCt is increased.

As shown in FIGS. 5(*b*) and 5(*c*), the weight coefficient α is set to 0 at the initial point of start of charging/discharging. When the temperature of the battery cell 10 is TH which is greater than or equal to the temperature threshold T1, as shown in FIG. 5(*b*), the weight coefficient α is set to increase from 0 in the transition period (for example, 5 seconds-10 seconds), and then remain at a relatively high constant value k2(for example, 0.9) shown in FIG. 5(*a*) in the steady state. With this configuration, the percentage of the SOCv in the combined SOct becomes higher.

When the temperature of the battery cell 10 is greater than or equal to the temperature threshold T1, the internal resistance of the battery cell 10 becomes low. In this case, the error in the open circuit voltage calculated by the above-described Equation (3) based on the terminal voltage of the battery cell 10 is small, and, consequently, the SOCv is precisely obtained. Because of this, the weight coefficient α is set large, and the percentage of the SOCv in the combined SOCt becomes larger than the percentage of the SOCi. As a result, the combined SOCt is precisely calculated.

On the other hand, when the temperature of the battery cell 10 is TL which is lower than the temperature threshold T1, as shown in FIG. 5(*c*), the weight coefficient α is set to increase from 0 during the transition period, and remain at a constant value k1(for example, 0.1) which is lower than the weight coefficient α in the steady state when the temperature of the battery cell 10 is greater than or equal to the temperature threshold T1 as shown in FIG. 5(*a*). With this configuration, the percentage of SOCi in the combined SOCt becomes larger.

When the temperature of the battery cell 10 is lower than the temperature threshold T1, the internal resistance of the battery cell 10 is high. In this case, the error in the open circuit voltage calculated by the above-described Equation (3) based on the terminal voltage of the battery cell 10 cannot be ignored, and the SOCv cannot be precisely obtained. Therefore, the weight coefficient α is set small so that the percentage of SOCi in the combined SOCt is set larger than the percentage of the SOCv. As a result, the combined SOCt is precisely calculated.

In this manner, the calculation processor 300 sets the weight coefficient α based on the temperature of the battery cell 10 detected by the temperature detection unit 130 so that the error in the combined SOCt with respect to the actual SOC of the battery cell 10 is reduced.

During the transition period after the start of charging or discharging of the battery cell 10, the open circuit voltage of the battery cell 10 is unstable. Therefore, during the transition period, the weight coefficient α is gradually increased from 0 so that the percentage of the SOCv in the combined SOCt can be gradually increased as the open circuit voltage of the battery cell 10 is stabilized. As a result, the combined SOCt during the transition period can be precisely calculated.

(4-2) Second Setting Example of Weight Coefficients

In the above-described example configuration of FIG. 4, because the current flowing in the battery cell 10 during the charging and discharging is constant, a method of setting the weight coefficient when the current flowing in the battery cell 10 changes is not described. In the following, as a second setting example of the weight coefficients, a setting example of the weight coefficient α during the charging and discharging (periods Tb and Td in FIG. 4) taking the current detected by the current detection unit 110 into consideration will be described.

Figure 6:
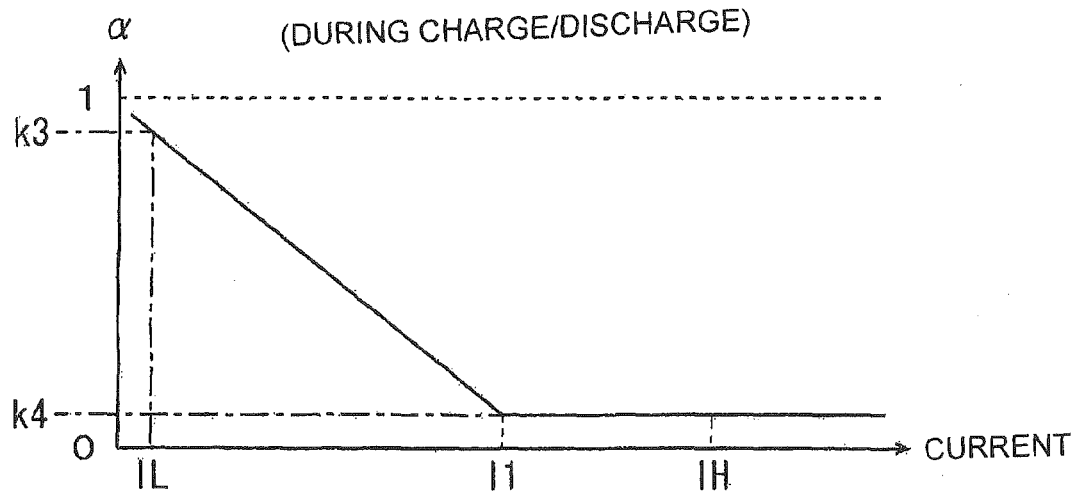
FIG. 6 is a diagram showing a relationship among a current detected by a current detection unit during charging/discharging, an elapsed time from start of charging/discharging, and a weight coefficient.
Figure 6:
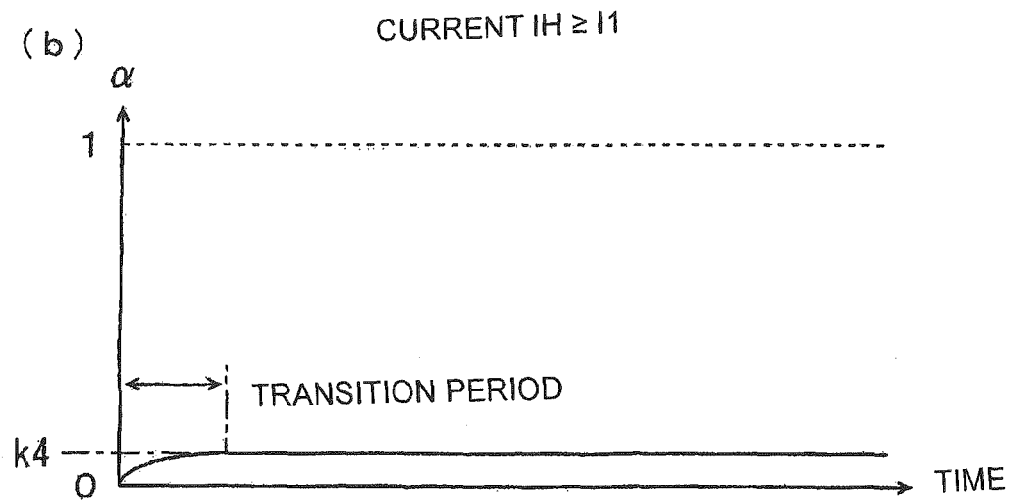
Figure 6:
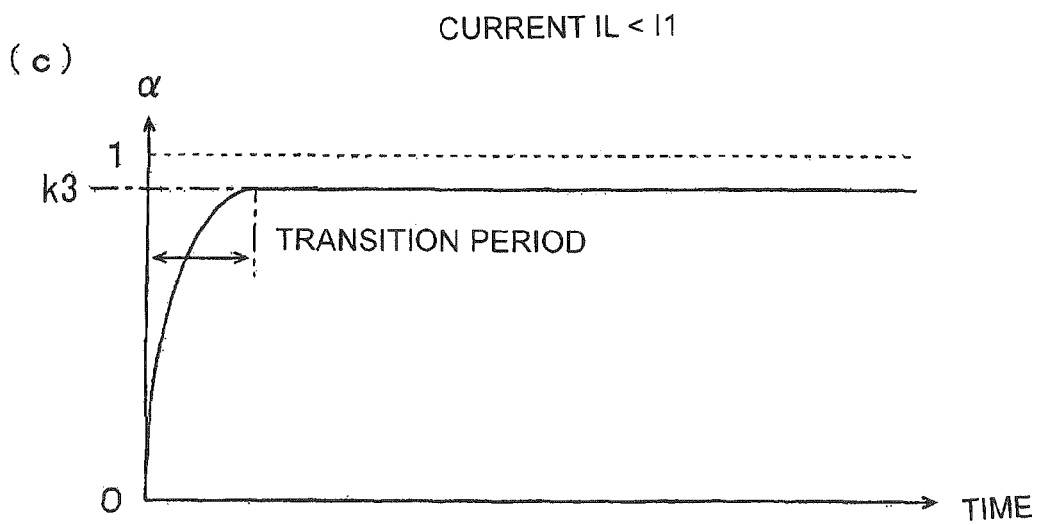

FIG. 6 is a diagram showing a relationship among the current detected by the current detection unit during charging or discharging, elapsed time from the start of the charging or discharging, and the weight coefficient α. In FIG. 6(*a*), the horizontal axis represents the current detected by the current detection unit 110, and the vertical axis represents the weight coefficient α. In FIGS. 6(*b*) and 6(*c*), the horizontal axis represents time and the vertical axis represents the weight coefficient α.

FIG. 6(*a*) shows a relationship between the current flowing in the battery cell 10 and the weight coefficient α. FIG. 6(*b*) shows a relationship between the elapsed time from the start of charging or discharging and the weight coefficient α when the current detected by the current detection unit 110 is IH which is greater than or equal to a current threshold I1 which is set in advance. FIG. 6(*c*) shows a relationship between the elapsed time from the start of the charging or discharging and the weight coefficient α when the current detected by the current detection unit 110 is IL which is lower than the current threshold I1. In the present embodiment, the current threshold I1 is, for example, 1 A.

As the current flowing in the battery cell 10 becomes larger, the current detected by the current detection unit 110 becomes sufficiently large compared to the noise, and the SOCi can be precisely calculated. Therefore, as shown in FIG. 6(*a*), when the current detected by the current detection unit 110 is lower than the current threshold I1, the weight coefficient α is set to decrease as the current increases. The weight coefficient α when the current detected by the current detection unit 110 is IL is a value k3. When the current detected by the current detection unit 110 is greater than or equal to the current threshold I1, the weight coefficient α is set constant at a relatively low value k4 (for example, 0.1). That is, the weight coefficient α when the current detected by the current detection unit 110 is IH is k4. With this configuration, when the current detected by the current detection unit 110 is greater than or equal to the current threshold I1, the percentage of the SOCi in the combined SOCt is set large.

As shown in FIGS. 6(*b*) and 6(*c*), the weight coefficient α is set to 0 at the initial point of the start of the charging or discharging. When the current detected by the current detection unit 110 is greater than or equal to the current threshold I1, as shown in FIG. 6(*b*), the weight coefficient α is set to increase during the transition period (for example, 5 seconds-10 seconds), and remain at a relatively low constant value k4 (for example, 0.1) as shown in FIG. 6(*a*) in the steady state. With this configuration, the percentage of the SOCi in the combined SOCt becomes small.

When the current flowing in the battery cell 10 is greater than or equal to the current threshold I1, the error in the internal resistance would significantly affect the calculation of the open circuit voltage of the battery cell 10, and the error of the open circuit voltage calculated by the above-described Equation (3) based on the terminal voltage of the battery cell 10 cannot be ignored. Therefore, the SOCv cannot be precisely obtained. In contrast, because the current detected by the current detection unit 110 becomes sufficiently large compared to the noise, the SOCi can be precisely calculated. Thus, the weight coefficient α is set small, so that the percentage of the SOCi in the combined SOCt is larger than the percentage of the SOCv. As a result, the combined SOCt is precisely calculated.

On the other hand, when the current detected by the current detection unit 110 is IL which is lower than the current threshold I1, as shown in FIG. 6(c), the weight coefficient α is set to increase from 0 during the transition period and remain at a constant k3 (for example, 0.9), which is higher than the weight coefficient α when the current detected by the current detection unit 110 is greater than or equal to the current threshold I1, in the steady state, as shown in FIG. 6(a). With this configuration, the percentage of the SOCv in the combined SOCt is set large.

When the current flowing in the battery cell 10 is lower than the current threshold I1, the influence of the error in the internal resistance is small for the calculation of the open circuit voltage, and thus, the open circuit voltage is precisely calculated from the above-described Equation (3) based on the terminal voltage of the battery cell 10. Therefore, the SOCv is precisely obtained. In contrast, with regard to the current detected by the current detection unit 110, the current tends to be affected by the noise, and the error in the SOCi becomes large. In consideration of this, the weight coefficient α is set large so that the percentage of the SOCv in the combined SOCt is set larger than the percentage of the SOCi. As a result, the combined SOCt is precisely calculated.

As described, the calculation processor 300 sets the weight coefficient α based on the current detected by the current detection unit 110, such that the error in the combined SOCt with respect to the actual SOC of the battery cell 10 is small.

During the transition period after the start of charging or discharging of the battery cell 10, the open circuit voltage of the battery cell 10 is unstable. Therefore, during the transition period, the weight coefficient α is gradually increased from 0 so that the percentage of the SOCv in the combined SOCt can be gradually increased as the open circuit voltage of the battery cell 10 is stabilized. As a result, the combined SOCt during the transition period can be precisely calculated.

(4-3) Third Setting Example of Weight Coefficients

In the above-described example configuration of FIG. 4, the combined SOCt is not taken into consideration in the setting of weight coefficients α and (1−α). As a third setting example of the weight coefficients, a setting example of the weight coefficient α during the charging and discharging (periods Tb and Td of FIG. 4) in consideration of the combined SOCt which is previously calculated by the calculation processor 300 will now be described.

Figure 7:
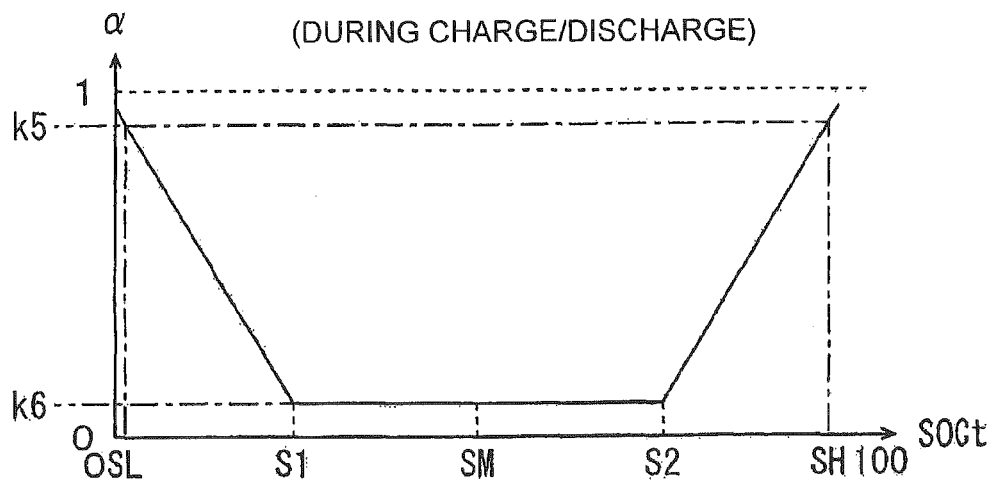
FIG. 7 is a diagram showing a relationship among a combined SOCt of a battery cell during charging/discharging, an elapsed time from start of charging/discharging, and a weight coefficient.
Figure 7:
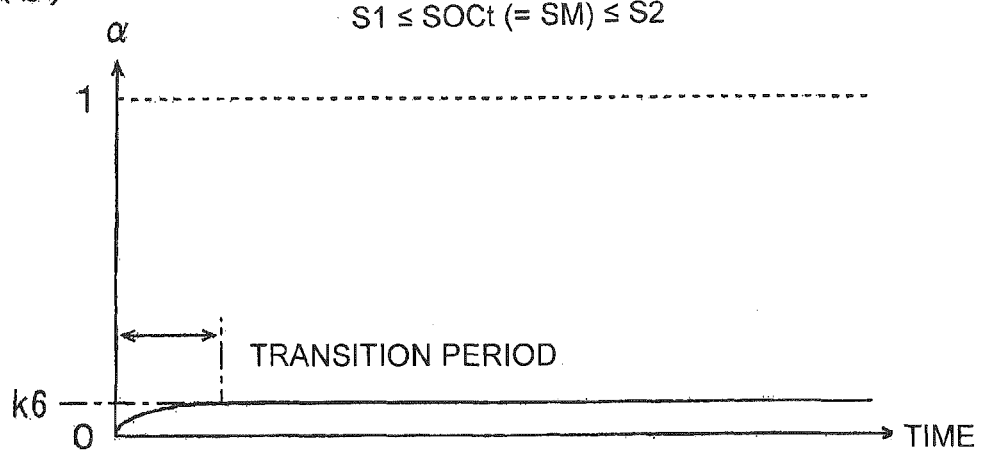
Figure 7:
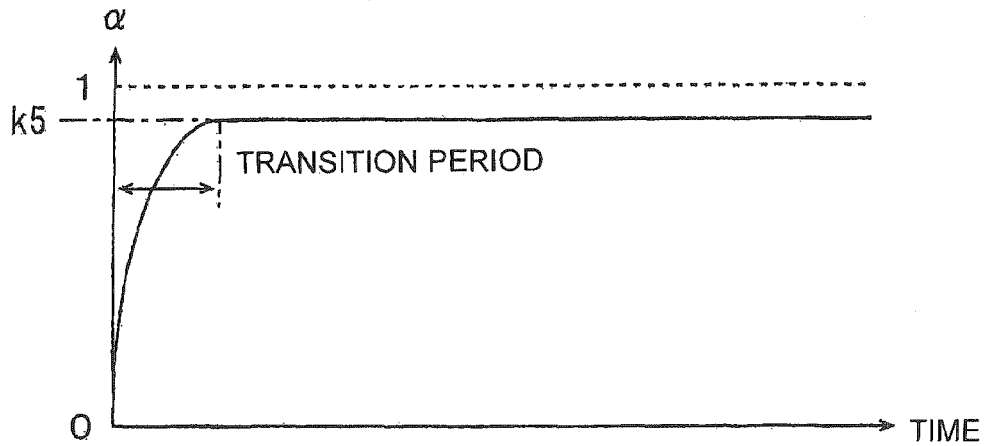

FIG. 7 is a diagram showing a relationship among the combined SOCt of the battery cell 10 during charging or discharging, the elapsed time from the start of the charging or discharging, and the weight coefficient α. In FIG. 7(a), the horizontal axis represents the combined SOCt and the vertical axis represents the weight coefficient α. In FIGS. 7(b) and 7(c), the horizontal axis represents time and the vertical axis represents the weight coefficient α. The combined SOCt in FIG. 7(a) is the combined SOCt which is previously calculated, and is stored in the storage unit 340 of the calculation processor 300.

FIG. 7(a) shows a relationship between the combined SOCt of the battery cell 10 and the weight coefficient α. FIG. 7(b) shows a relationship between the elapsed time from the start of charging or discharging and the weight coefficient α when the combined SOCt of the battery cell 10 is SM which is greater than or equal to a first SOCt threshold S1 which is set in advance and less than or equal to a second SOCt threshold S2 which is set in advance. FIG. 7(c) shows a relationship between the elapsed time from the start of charging or discharging and the weight coefficient α when the combined SOCt of the battery cell 10 is SL which is lower than the first SOCt threshold S1 or SH which is greater than the second SOCt threshold S2.

When the combined SOCt of the battery cell 10 is lower than the first SOCt threshold S1, as shown in FIG. 2, the change of SOC with respect to the change of the open circuit voltage of the battery cell 10 is small. Similarly, when the combined SOCt of the battery cell 10 is greater than the second SOCt threshold S2, as shown in FIG. 2, the change of the SOC with respect to the change of the open circuit voltage of the battery cell 10 is small. In these cases, even if there is a slight error in the open circuit voltage calculated from the terminal voltage detected by the voltage detection unit 120, the influence of the error in the open circuit voltage on the calculation of the SOCv is small. Therefore, the SOCv can be precisely obtained. Because of this, the weight coefficient α is set large so that the percentage of the SOCv in the combined SOCt is set large. As a result, the combined SOCt is precisely calculated.

On the other hand, when the combined SOCt of the battery cell 10 is greater than or equal to the first SOCt threshold S1 and less than or equal to the second SOCt threshold S2, as shown in FIG. 2, the change of the SOC with respect to the change of the open circuit voltage of the battery cell 10 is large. In this case, even when the error of the open circuit voltage calculated from the terminal voltage detected by the voltage detection unit 120 is small, the influence of the error in the open circuit voltage on the calculation of the SOCv is large. Thus, it is difficult to precisely obtain the SOCv. In consideration of this, the weight coefficient α is set small so that the percentage of the SOCv in the combined SOCt is small. As a result, the combined SOCt is precisely calculated.

As shown in FIG. 7(a), when the combined SOCt of the battery cell 10 is lower than the first SOCt threshold S1, the weight coefficient α is set to decrease with the increase of the combined SOCt. When the combined SOCt of the battery cell 10 is greater than the second SOCt threshold S2, the weight coefficient α is set to increase with the increase in the combined SOCt. When the combined SOCt of the battery cell 10 is SL or SH, the weight coefficient α is set at a value of k5.

When the combined SOCt of the battery cell 10 is greater than or equal to the first SOCt threshold S1 and less than or equal to the second SOCt threshold S2, the weight coefficient α is set to be a constant at a relatively low value k6 (for example, 0.1). That is, the weight coefficient α when the combined SOCt of the battery cell 10 is SM is k6. With this configuration, the percentage of the SOCi in the combined SOCt is set large when the combined SOCt of the battery cell 10 is greater than or equal to the first SOCt threshold S1 and less than or equal to the second SOCt threshold S2.

As shown in FIGS. 7(b) and 7(c), the weight coefficient α is set at 0 at the initial point of the start of charging or discharging. When the combined SOCt of the battery cell 10 is SM which is greater than or equal to the first SOCt threshold S1 and less than or equal to the second SOCt threshold S2, as shown in FIG. 7(b), the weight coefficient α is set to increase from 0 during the transition period (for example, 5 seconds-10 seconds), and remain at a relatively low constant value k6 (for example, 0.1) as shown in FIG. 7(a) in the steady state. With this configuration, the percentage of the SOCi in the combined SOCt becomes large.

On the other hand, when the combined SOCt of the battery cell 10 is SL which is lower than the first SOCt threshold S1, as shown in FIG. 7(c), the weight coefficient α is set to increase from 0 during the transition period, and remain at a constant value k5 (for example, 0.9), which is greater than the weight coefficient α when the combined SOCt of the battery cell 10 is greater than or equal to the first SOCt threshold S1 and less than or equal to the second SOCt threshold S2 as shown in FIG. 7(a), in the steady state. Similarly, when the combined SOCt of the battery cell 10 is SH which is greater than the second SOCt threshold S2, as shown in FIG. 7(c), the weight coefficient α is set to increase from 0 during the transition period, and remain at a constant value k5 (for example, 0.9), which is greater than the weight coefficient α when the combined SOCt of the battery cell 10 is greater than or equal to the first SOCt threshold S1 and less than or equal to the second SOCt threshold S2 as shown in FIG. 7(a) in the steady state. With this configuration, the percentage of the SOCv in the combined SOCt is set large.

As described, the calculation processor 300 sets a suitable weight coefficient α based on the state of the combined SOCt which is previously calculated, that is, the combined SOCt which is previously calculated, so that the combined SOCt is precisely calculated. During the transition period after the start of charging or discharging of the battery cell 10, the open circuit voltage of the battery cell 10 is unstable. Therefore, during the transition period, the weight coefficient α is gradually increased from 0 so that the percentage of the SCOv in the combined SOCt can be gradually increased as the open circuit voltage of the battery cell 10 is stabilized. As a result, the calculation processor 300 can precisely calculate the combined SOCt during the transition period.

In order to prevent excessive discharging and excessive charging of each battery cell 10, a tolerance voltage range of the terminal voltage of the battery cell 10 is defined. In the present embodiment, the first SOCt threshold S1 is set to be a value slightly (for example, 10%) larger than the combined SOCt when the terminal voltage of the battery cell 10 is at the lower limit value (discharge termination voltage) of the tolerance voltage range. Similarly, the second SOCt threshold S2 is set at a value slightly lower (for example, 10%) than the combined SOCt when the terminal voltage of the battery cell 10 is at an upper limit value (charge termination voltage) of the tolerance voltage range.

More specifically, in the case where the battery system 500 is equipped in an electric vehicle, the first SOCt threshold S1 is set, for example, at 25% and the second SOCt threshold S2 is set, for example, at 75%. When the battery system 500 is equipped on an electricity storage device, the first SOCt threshold S1 is set, for example, at 40% and the second SOCt threshold S2 is set, for example, at 60%.

(4-4) Fourth Setting Example of Weight Coefficients

The first through third setting examples of the weight coefficients described above are setting examples of the weight coefficient α during charging or discharging (periods Tb and Td of FIG. 4) of the battery cell 10. A fourth setting example of the weight coefficient to be described below is a setting example of the weight coefficient α during a period where the charging or discharging is stopped (periods Ta, Tc, and Te of FIG. 4) for the battery cell 10.

Immediately after charging or discharging is stopped, the open circuit voltage of the battery cell 10 is unstable. Because of this, precision of the SOCv to be calculated is reduced. Thus, in the period where the charging or discharging of the battery cell 10 is stopped, a suitable weight coefficient α is set based on the combined SOCt of the battery cell 10 stored in the storage unit 340 and a transfer period having a length of less than or equal to the transition period from the time when the charging or discharging of the battery cell 10 is stopped to the time when the steady state is reached. Specifically, the weight coefficient α is set to increase from a value smaller than the weight coefficient (1−α) to a value larger than the weight coefficient (1−α) in the transfer period from the time when the charging or discharging is stopped. With this configuration, the percentage of the SOCv in the combined SOCt is gradually increased from a small value to a large value. As a result, the combined SOCt calculated during the transition period immediately after the stopping of the charging or discharging can be precisely maintained.

In the present embodiment, immediately after stopping of the charging or discharging of the battery cell 10, the weight coefficient α is set to 0. Then, after the predetermined transfer period t1 is elapsed, the weight coefficient α is set to 1. The transfer period t1 is a period in which the weight coefficient α changes from 0 to 1 from the stopping of the charging or discharging of the battery cell 10, and is, for example, 2 seconds-10 seconds.

Figure 8:
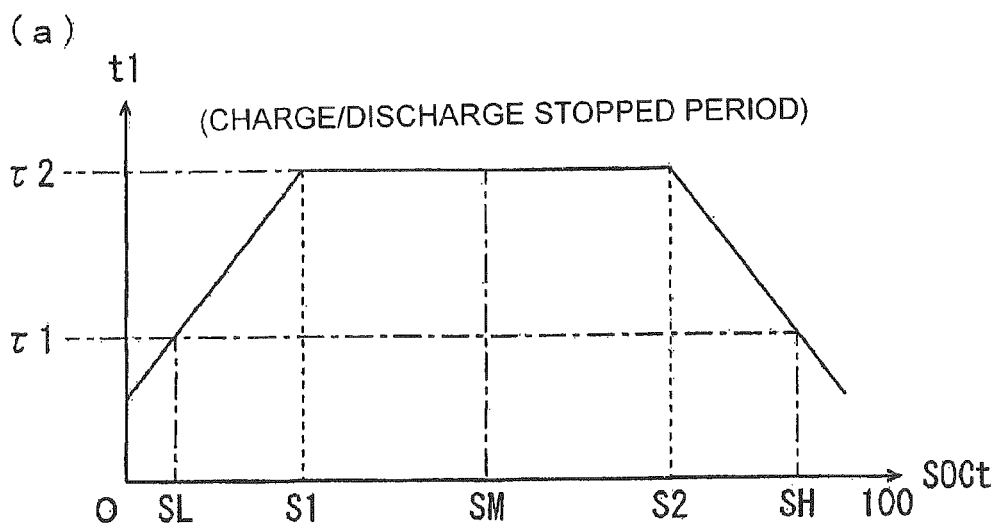
FIG. 8 is a diagram showing a relationship among a combined SOCt of a battery cell during a charging/discharging stopped state, a transfer period, an elapsed time from stopping of charging/discharging, and a weight coefficient.
Figure 8:
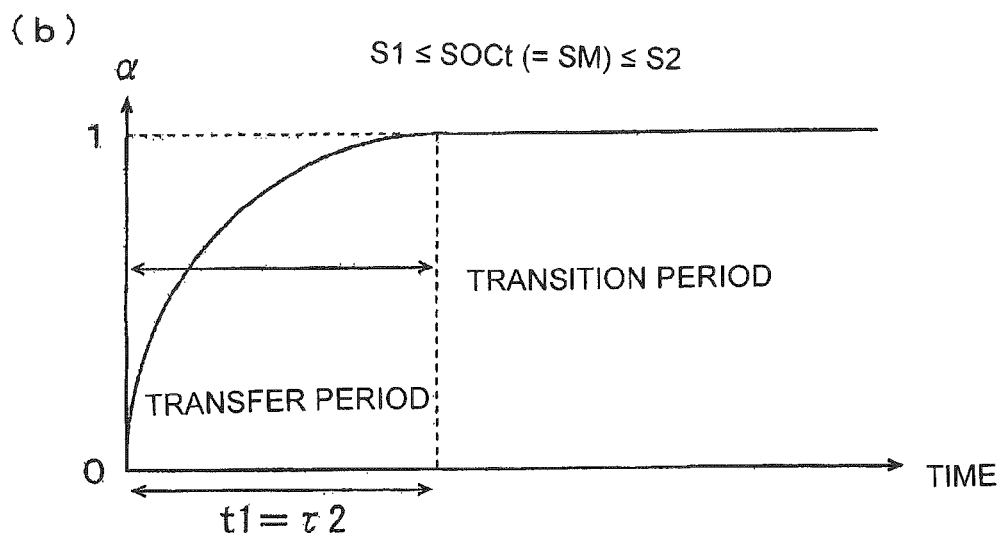
Figure 8:
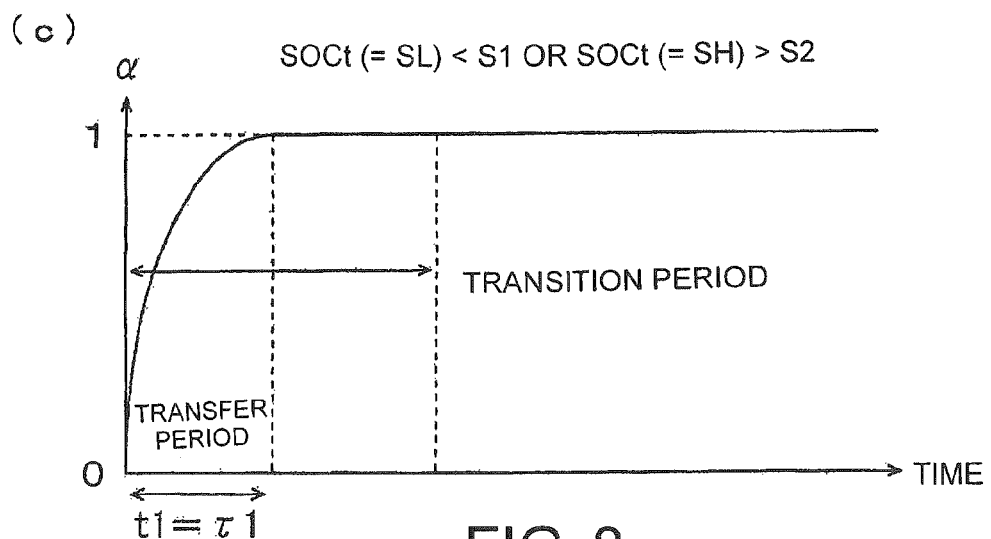

FIG. 8 is a diagram showing a relationship among the combined SOCt of the battery cell 10 in a period where the charging or discharging is stopped, the transfer period t1, the elapsed time from the stopping of the charging or discharging, and the weight coefficient α. In FIG. 8(a), the horizontal axis represents the combined SOCt, and the vertical axis represents the transfer period t1. In FIGS. 8(b) and 8(c), the horizontal axis represents the time, and the vertical axis represents the weight coefficient α.

FIG. 8(a) shows a relationship between the combined SOCt of the battery cell 10 and the transfer period t1. FIG. 8(b) shows a relationship between the elapsed time from the stopping of the charging or discharging and the weight coefficient α when the combined SOCt of the battery cell 10 is SM which is greater than or equal to a first SOCt threshold S1 which is set in advance and less than or equal to a second SOCt threshold S2 which is set in advance. FIG. 8(c) shows a relationship between the elapsed time from the stopping of the charging or discharging and the weight coefficient α when the combined SOCt of the battery cell 10 is SL which is lower than the first SOCt threshold S1 or SH which is greater than the second SOCt threshold S2. The combined SOCt of FIG. 8(a) is the SOCt which is previously calculated, and is stored in the storage unit 340 of the calculation processor 340.

Here, the first SOCt threshold S1 and the second SOCt threshold S2 are set in a manner similar to the first SOCt threshold S1 and the second SOCt threshold S2 in the third setting example.

As shown in FIG. 8(a), when the combined SOCt of the battery cell 10 is lower than the first SOCt threshold S1, the transfer period t1 is set to increase to a preset value τ2 with the increase of the combined SOCt. When the combined SOCt of the battery cell 10 is greater than the second SOCt threshold S2, the transfer period t1 is set to decrease from the preset value τ2 with the increase in the combined SOCt. When the combined SOCt of the battery cell 10 is SL or the combined SOCt of the battery cell 10 is SH, the transfer period ti is τ1.

When the combined SOCt of the battery cell 10 is greater than or equal to the first SOCt threshold S1 and less than or equal to the second SOCt threshold S2, the transfer period t1 is set to maintain the preset value (for example, 10 seconds). In other words, the transfer period t1 when the combined SOCt of the battery cell 10 is SM is τ2.

When the combined SOCt of the battery cell 10 is SM which is greater than or equal to the first SOCt threshold S1 and less than or equal to the second SOCt threshold S2, as shown in FIG. 8(b), the weight coefficient α is set to gradually increase from 0 to 1 during the transfer period t1 and remain at 1 after the elapse of the transfer period t1. Here, the transfer period t1 is τ2 (for example, 10 seconds) shown in FIG. 8(a).

On the other hand, when the combined SOCt of the battery cell 10 is SL which is lower than the first SOCt threshold S1, as shown in FIG. 8(c), the weight coefficient α is set to rapidly increase from 0 to 1 during the transfer period t1 and remain at 1 after the elapse of the transfer period t1. Here, the transfer period t1 is τ1 (for example, 2 seconds) shown in FIG. 8(a). Similarly, when the combined SOCt of the battery cell 10 is SH which is greater than the second SOCt threshold S2, as shown in FIG. 8(c), the weight coefficient α is set to rapidly increase from 0 to 1 during the transfer period t1 and remain at 1 after the elapse of the transfer period t1. Here, the transfer period t1 is τ1 (for example, 2 seconds) shown in FIG. 8(a).

When the combined SOCt of the battery cell 10 is greater than or equal to the first SOCt threshold S1 and less than or equal to the second SOCt threshold S2, as shown in FIG. 2, a change of the SOC with respect to a change of the open circuit voltage is large. In these cases, even when there is a slight error in the terminal voltage (open circuit voltage) detected by the voltage detection unit 120, the SOC would significantly vary. Therefore, it is difficult to precisely obtain the SOCv. Thus, as shown in FIG. 8(b), the transfer period t1 is set large. In this case, the weight coefficient α becomes 1 after the transition period is elapsed. Therefore, during the transition period, the weight coefficient α can be gradually increased from 0, so that the combined SOC calculation unit 330 can gradually increase the percentage of the SOCv in the combined SOCt as the open circuit voltage of the battery cell 10 is stabilized. As a result, the calculation processor 300 can precisely calculate the combined SOCt during the transition period.

On the other hand, when the combined SOCt of the battery cell 10 is lower than the first SOCt threshold S1, as shown by the graph of FIG. 2, the change of SOC with respect to the change of the open circuit voltage of the battery cell 10 is small compared to the case where the combined SOCt of the battery cell 10 is in a range of greater than or equal to the first SOCt threshold S1 and less than or equal to the second SOCt threshold S2. In other words, the influence of the variation of the open circuit voltage on the SOCv is small.

Similarly, when the combined SOCt of the battery cell 10 is greater than the second SOCt threshold S2, as shown in the graph of FIG. 2, the change of SOC with respect to the change of the open circuit voltage of the battery cell 10 is smaller compared to the case where the combined SOCt of the battery cell 10 is in the range of greater than or equal to the first SOCt threshold S1 and less than or equal to the second SOCt threshold S2. In other words, the influence of the variation of the open circuit voltage on the SOCv is small.

In these cases, even when there is a slight error in the terminal voltage (open circuit voltage) detected by the voltage detection unit 120, the SOCv is precisely obtained. In other words, the precision of the SOCv calculated immediately after the stopping of the charging or discharging would become a certain value or greater in a short period of time. Therefore, as shown in FIG. 8(c), the calculation processor 300 can rapidly coincide the combined SOCt to the SOCv. Therefore, the transfer period t1 in the case where the combined SOCt which is already calculated is lower than the first SOCt threshold S1 or is greater than the second SOCt threshold S2 is set shorter than the transfer period t1 in the case where the combined SOCt which is already calculated is greater than or equal to the first SOCt threshold S1 and less than or equal to the second SOCt threshold S2.

In this manner, the period in which the precision of the SOCv which is calculated immediately after the stopping of the charging or discharging of the battery cell 10 becomes a value greater than or equal to a certain value varies depending on the combined SOCt of the battery cell 10. Therefore, the transfer period t1 is changed based on the state of the combined SOCt which is previously calculated, that is, the combined SOCt which is previously calculated. Specifically, the calculation processor 300 increases the percentage of the SOCv in the combined SOCt from 0 to 1 as quickly and smoothly as possible. With this configuration, the calculation processor 300 can prevent the percentage of the SOCv in the combined SOCt to become large before the precision of the calculated SOCv becomes a certain precision or greater. As a result, the combined SOCt which is calculated in the transition period immediately after stopping of the charging or discharging can be precisely maintained.

(4-5) Other Setting Examples of Weight Coefficients

The calculation processor 300 can set the weight coefficients α and (1−α) combining the first through fourth setting examples of weight coefficients described above. The first setting example of the weight coefficients considers a case where the current detected by the current detection unit 110 is lower than the current threshold I1. In addition, the first setting example of the weight coefficients considers a case where the combined SOCt of the battery cell 10 is lower than the first SOCt threshold S1 or is greater than the second SOCt threshold S2.

In the first setting example of the weight coefficients, when the current detected by the current detection unit 110 is greater than or equal to the current threshold I1, the value k2 of the weight coefficient α is set to be a value less (for example, 0.8) than the value k2(for example, 0.9) of α in FIG. 5(b), and the value k1of the weight coefficient α is set to a value less (for example, 0) than the value k1(for example, 0.1) of the weight coefficient α of FIG. 5(c). Similarly, in the first setting example of the weight coefficients, when the combined SOCt of the battery cell 10 is greater than or equal to the first SOCt threshold S1 and less than or equal to the second SOCt threshold S2, the value k2of the weight coefficient α is set to a value less (for example, 0.8) than the value k2(for example, 0.9) of the weight coefficient α of FIG. 5(b), and the value k1of the weight coefficient α is set to a value less (for example, 0) than the value k1(for example, 0.1) of the weight coefficient α of FIG. 5(c).

The second setting example of weight coefficients considers a case where the temperature detected by the temperature detection unit 130 is greater than or equal to the temperature threshold T1. In addition, the second setting example of weight coefficients considers a case where the combined SOCt of the battery cell 10 is lower than the first SOCt threshold S1 or is greater than the second SOCt threshold S2.

In the second setting example of weight coefficients, when the temperature detected by the temperature detection unit 130 is lower than the temperature threshold T1, the value k4 of the weight coefficient α is set to a value less (for example, 0) than the value k4 (for example, 0.1) of α of FIG. 6(b), and the value k3 of the weight coefficient α is set to a value less (for example, 0.8) than the value k3 (for example, 0.9) of the weight coefficient α of FIG. 6(c). Similarly, in the second setting example of weight coefficients, when the combined SOCt of the battery cell 10 is greater than or equal to the first SOCt threshold S1 and less than or equal to the second SOCt threshold S2, the value k4 of the weight coefficient α is set at a value less (for example, 0) than the value k4 (for example, 0.1) of the weight coefficient α of FIG. 6(*b*), and the value k3 of the weight coefficient α is set to a value less (for example, 0.8) than the value k3 (for example, 0.9) of weight coefficient α of FIG. 6(*c*).

The third setting example of the weight coefficients considers a case where the temperature detected by the temperature detection unit 130 is greater than or equal to the temperature threshold T1. The third setting example of the weight coefficients also considers a case where the current detected by the current detection unit 110 is lower than the current threshold I1.

In the third setting example of the weight coefficients, when the temperature detected by the temperature detection unit 130 is lower than the temperature threshold T1, the value k6 of the weight coefficient α is set to a value less (for example, 0) than the value k6 (for example, 0.1) of the weight coefficient α of FIG. 7(*b*), and the value k5 of the weight coefficient α is set to a value less (for example, 0.8) than the value k5 (for example, 0.9) of the weight coefficient α of FIG. 7(*c*). Similarly, in the third setting example of the weight coefficients, when the current detected by the current detection unit 110 is greater than or equal to the current threshold I1, the value k6 of the weight coefficient α is set to a value less (for example, 0) than the value k6 (for example, 0.1) of the weight coefficient α of FIG. 7(*b*), and the value k5 of the weight coefficient α is set to a value less (for example, 0.8) than the value k5 (for example, 0.9) of the weight coefficient α of FIG. 7(*c*).

The fourth setting example of the weight coefficients considers a case where the temperature detected by the temperature detection unit 130 is greater than or equal to the temperature threshold T1. The fourth setting example of the weight coefficients also considers a case where the current detected by the current detection unit 110 is less than the current threshold I1.

In the fourth setting example of the weight coefficients, when the temperature detected by the temperature detection unit 130 is lower than the temperature threshold T1, the value τ2 of the transfer period t1 is set to a value approximately equal (for example, 10 seconds) to the value τ2 (for example, 10 seconds) of the transfer period t1 of FIG. 8(*b*), and the value τ1 of the transfer period t1 is set to a value greater (for example, 3 seconds) than the value τ1 (for example, 2 seconds) of the transfer period t1 of FIG. 8(*c*). Similarly, in the fourth setting example of the weight coefficients, when the current detected by the current detection unit 110 is greater than or equal to the current threshold I1, the value τ2 of the transfer period t1 is set to a value approximately equal (for example, 10 seconds) to the value τ2 (for example, 10 seconds) of the transfer period t1 of FIG. 8(*b*), and the value τ1 of the transfer period t1 is set to a value greater (for example, 3 seconds) than the value τ1 (for example, 2 seconds) of the transfer period t1 of FIG. 8(*c*).

(5) Advantages

The battery system 500 according to the present embodiment comprises the battery cell 10 and the calculation processor 300 which is a state-of-charge calculation unit that calculates the SOC which is a state of charge of the battery cell 10. The calculation processor 300 comprises the current-based SOC calculation unit 310 which is a first state-of-charge calculation unit, the voltage-based SOC calculation unit which is a second state-of-charge calculation unit, and the combined SOC calculation unit 330 which is a combining unit. The current-based SOC calculation unit 310 calculates the SOC of the battery cell 10 based on the current flowing in the battery cell 10 as the SOCi which is a first state of charge. The voltage-based SOC calculation unit 320 calculates the SOC of the battery cell 10 based on the terminal voltage of the battery cell 10 as the SOCv which is a second state of charge. The combined SOC calculation unit 330 weights the SOCi calculated by the current-based SOC calculation unit 310 and the SOCv calculated by the voltage-based SOC calculation unit 320 respectively with weight coefficients (1−α) and α which are first and second weight coefficients, respectively, and combines the weighted SOCi and the weighed SOCv to calculate the combined SOCt which is a combined state of charge. In addition, the combined SOC calculation unit 330 determines the weight coefficients α and (1−α) based on whether the battery cell 10 is in a charging state, a discharging state, or a charge/discharge stopped state.

The precision of the calculated SOCi and the precision of the calculated SOCv vary depending on whether the battery cell is in the charging state, discharging state, or charge/discharge stopped state. Thus, the weight coefficients α and (1−α) are determined based on whether the battery cell is in the charging state, discharging state, or charge/discharge stopped state. With this configuration, the calculation processor 300 can precisely calculate the SOC of the battery cell 10 as the combined SOCt.

In addition, in the present embodiment, the combined SOC calculation unit 330 determines the weight coefficients α and (1−α) based on at least one of the temperature of the battery cell 10, the current flowing in the battery cell 10, and the combined SOCt which is previously calculated. With this configuration, the SOC of the battery cell 10 can be precisely calculated.

Moreover, in the present embodiment, the combined SOC calculation unit 330 continuously changes the weight coefficients α and (1−α) to determined values at the time of switching between charging, discharging, and charge/discharge stopped states.

With this configuration, even when the SOCi or the SOCv of the battery cell 10 is not stable at the time of switching between charging, discharging, and charge/discharge stopped states, the calculation processor 300 can inhibit discontinuous change of the calculated combined SOCt. As a result, the SOC of the battery cell 10 can be calculated with a high precision.

Furthermore, in the present embodiment, the combined SOC calculation unit 330 increases the weight coefficient α from a value less than the weight coefficient (1−α) to a value greater than the weight coefficient (1−α) in a transfer period having a length of less than or equal to the transition period from the time of stopping of charging or discharging of the battery cell 10 to the steady state.

With this configuration, the percentage of the SOCv in the combined SOCt gradually increases from a small value to a large value. As a result, the combined SOCt which is calculated in the transition state immediately after the charging or discharging is stopped can be precisely maintained.

In addition, in the present embodiment, the battery system 500 further comprises an output unit 140 which outputs at least one of the weight coefficients α and (1−α) and the combined SOCt calculated by the combined SOC calculation unit 330.

In this case, during maintenance of the battery system 500, the worker can easily understand the SOC of the battery cell 10. In addition, the user of the battery system 500 can easily understand the SOC of the battery cell 10.

The combining unit (combined SOC calculation unit 330) may change, when the charging or discharging of the battery cell 10 is stopped, the transfer period t1 based on the combined state of charge (combined SOCt) which is already calculated.

In addition, the combining unit may set the transfer period t1 in the case where the combined state of charge which is already calculated is lower than a first value (first SOCt threshold S1) or is greater than a second value (second SOCt threshold S2) greater than the first value to be shorter than the transfer period t1 in the case where the combined state of charge which is already calculated is greater than or equal to the first value and less than or equal to the second value.

[2] Second Preferred Embodiment (1) Charge/Discharge Coefficient

A battery system 500 according to a second preferred embodiment of the present invention will now be described in relation to a difference from the battery system 500 according to the first preferred embodiment. In the battery system 500 of the present embodiment, the calculation processor 300 introduces a charge/discharge coefficient $\beta$ to be described below, in the calculation of the SOC.

When the battery cell 10 is to be discharged at a discharge rate forming a reference, the SOCi is calculated by the Equation (1) based on the integrated value of current detected by the current detection unit 110. The discharge rate in this process will hereinafter be referred to as a reference discharge rate. However, when the battery cell 10 is to be discharged at a rate greater than the reference discharge rate, the amount of charge remaining in the battery cell 10 would be smaller than the amount of charge remaining in the battery cell 10 when the battery cell 10 is discharged at the reference discharge rate. Here, the reference discharge rate is, for example, 1 C.

Similarly, when the battery cell 10 is to be charged at a charge rate forming a reference, the SOCi is calculated by the Equation (1) based on the integrated value of the current detected by the current detection unit 110. The charge rate in this process will hereinafter be called a reference charge rate. However, when the battery cell 10 is to be charged at a rate higher than the reference charge rate, the amount of charge accumulated in the battery cell 10 would be larger than the amount of charge accumulated in the battery cell 10 when the battery cell 10 is charged at the reference charge rate. The reference charge rate is, for example, 1 C.

On the other hand, when the battery cell 10 is to be discharged at a discharge rate lower than the reference discharge rate, the amount of charge remaining in the battery cell 10 would be larger than the amount of charge remaining in the battery cell 10 when the battery cell 10 is discharged at the reference discharge rate. Similarly, when the battery cell 10 is to be charged with a charge rate lower than the reference charge rate, the amount of charge accumulated in the battery cell 10 would be smaller than the amount of charge accumulated in the battery cell 10 when the battery cell 10 is charged at the reference charge rate.

In these cases, the calculation processor 300 can calculate the SOCi by the following Equation (4) in place of the Equation (1). In Equation (4), SOCt(t-1) is the combined SOCt which is calculated at a time (t-1), which is previous time by a predetermined period, $\Sigma I$ is an integrated amount of current from the time (t-1) which is previous time by predetermined period to time t, and FCC is the fully charged capacity.

$$SOCi(t)=SOCt(t-1)+\Sigma I/FCC[\%]- \quad (4)$$

When a difference between the actual charge rate or the actual discharge rate of the battery cell 10 and the reference charge rate or the reference discharge rate is large, the error in the actual SOC of the battery cell 10 with respect to the SOCi calculated by the Equation (1) would be large. In this case, the SOCi calculated by the Equation (1) is preferably corrected. In this case, the calculation processor 300 calculates the SOCi using the below-described Equation (4') in place of the Equation (4). In this equation, $\beta$ is called a charge/discharge coefficient.

$$SOCi(t)=SOCt(t-1)+\beta \times \Sigma I/FCC[\%]- \quad (4')$$

(2) Advantages

When the actual charge rate of the battery cell 10 is greater than the reference charge rate, the charge/discharge coefficient $\beta$ is set to be greater than 1. Similarly, when the actual discharge rate of the battery cell 10 is greater than the reference discharge rate, the charge/discharge coefficient $\beta$ is set to be greater than 1. On the other hand, when the actual charge rate of the battery cell 10 is lower than the reference charge rate, the charge/discharge coefficient $\beta$ is set to be less than 1. Similarly, when the actual discharge rate of the battery cell 10 is lower than the reference discharge rate, the charge/discharge coefficient $\beta$ is set to be less than 1. With this configuration, the current-based SOC calculation unit 310 can more precisely calculate the SOCi.

The output unit 140 of FIG. 1 outputs, in addition to the combined SOCt and the weight coefficients $\alpha$ and $(1-\alpha)$, the charge/discharge coefficient $\beta$ calculated by the calculation processor 300 as a display of text or the like. With this process, during maintenance of the battery system 500, a worker can easily understand the state of charge of the battery cell 10. In addition, the user of the battery system 500 can easily understand the state of charge of the battery cell 10.

(3) Alternative Configuration

In the second preferred embodiment, because the actual charge/discharge rate of the battery cell 10 is equal to the reference charge/discharge rate, the charge/discharge coefficient $\beta$ is set to 1. In this case, the SOCi calculated by the Equation (4) is equal to the SOCi calculated by the Equation (1).

The calculation processor 300 may calculate the SOCi by the following Equation (5) in place of the Equation (4). In Equation (5), SOCi(t-1) is the SOCi at the time (t-1) which is a previous time by a predetermined period. In this case also, the current-based SOC calculation unit 310 can more precisely calculate the SOCi.

$$SOCi(t)=SOCi(t-1)+\beta \times \Sigma I/FCC[\%]- \quad (5)$$

[3] Third Preferred Embodiment

A battery system 500 according to a third preferred embodiment of the present invention will now be described in relation to a difference from the battery system 500 of the first preferred embodiment of the present invention. In the battery system 500 of the present embodiment, the calculation processor 300 further calculates an SOC for display (hereinafter referred to as "display SOCd").

(1) Display SOCd

When the terminal voltage of the battery cell 10 reaches the discharge termination voltage, the calculation processor 300 stops discharging of the battery cell 10 in order to prevent excessive discharge. Similarly, when the terminal voltage of the battery cell 10 reaches the charge termination voltage, the calculation processor 300 stops the charging of the battery cell 10 in order to prevent excessive charge. Therefore, the SOC of the battery cell 10 when the battery cell 10 reaches the discharge termination voltage is greater than 0%, and the SOC of the battery cell 10 when the battery cell 10 reaches the charge termination voltage is less than 100%. Thus, the combined SOCt changes in the range from a value corresponding to the discharge termination voltage to a value corresponding to the charge termination voltage, and does not change in the range of 0% to 100%.

However, when the terminal voltage of the battery cell 10 reaches the discharge termination voltage, the discharging of the battery cell 10 is stopped. Because of this, for the user of the battery system 500, when the terminal voltage of the battery cell 10 has reached the discharge termination voltage, even though the actual SOC of the battery cell 10 is greater than 0%, the SOC of the battery cell 10 is preferably displayed as, for example, 0%. Similarly, when the terminal voltage of the battery cell 10 reaches the charge termination voltage, the charging of the battery cell 10 is stopped. Because of this, for the user of the battery system 500, when the terminal voltage of the battery cell 10 has reached the charge termination voltage, even though the actual SOC of the battery cell 10 is less than 100%, the SOC of the battery cell 10 is preferably displayed, for example, as 100%.

Figure 9:
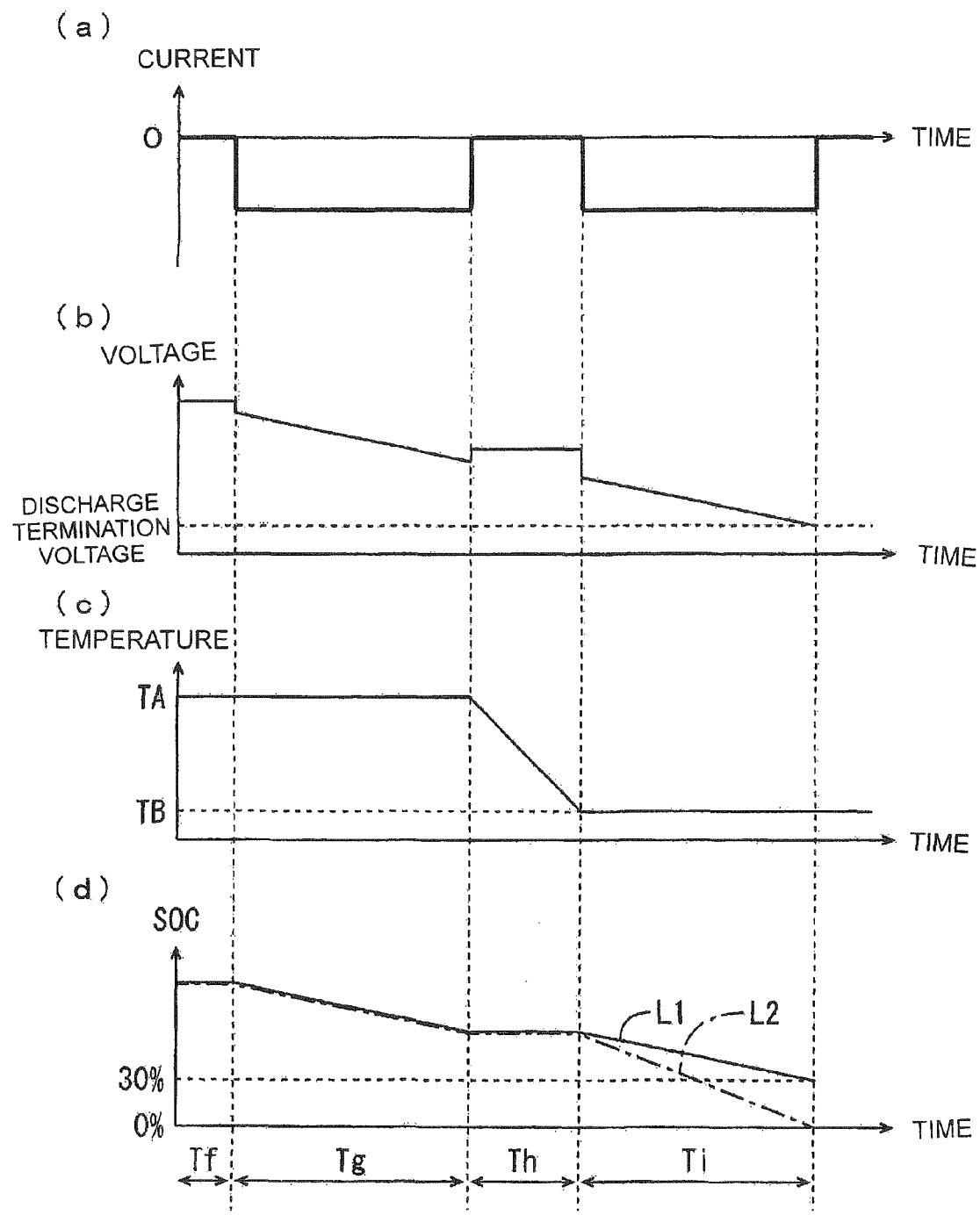
FIG. 9 is a diagram showing changes with respect to time of a current detected by a current detection unit, a voltage detected by a voltage detection unit, a temperature detected by a temperature detection unit, and an SOC.

FIG. 9 is a diagram showing changes with respect to time of the current detected by the current detection unit 110, the voltage detected by the voltage detection unit 120, the temperature detected by the temperature detection unit 130, and the SOC. In FIGS. 9(a)-9(d), the horizontal axis represents time. In FIG. 9(a), the vertical axis represents the current detected by the current detection unit 110. The current during the charging is represented with a positive value and the current during the discharging is represented with a negative value. In FIG. 9(b), the vertical axis represents the voltage detected by the voltage detection unit 120. In FIG. 9(c), the vertical axis represents the temperature detected by the temperature detection unit 130. In FIG. 9(d), the vertical axis represents the SOC of the battery cell 10.

In FIGS. 9(a)-9(d), in periods Tf and Th, the battery cell 10 is not charged or discharged. In this case, as shown in FIG. 9(a), no current flows in the battery cell 10. In addition, as shown in FIG. 9(b), the terminal voltage of the battery cell 10 is maintained constant. In periods Tg and Ti, the battery cell 10 is discharged at the reference discharge rate. In this case, as shown in FIG. 9(a), a negative current flows in the battery cell 10. In addition, as shown in FIG. 9(b), the terminal voltage of the battery cell 10 is reduced as time elapses, with a slope corresponding to the reference discharge rate.

The terminal voltage of the battery cell 10 at the start of the period Tg is lower than the terminal voltage of the battery cell 10 at the end of the period Tf by an amount corresponding to the voltage drop by the internal resistance of the battery cell 10 (product of the internal resistance and the current flowing in the battery cell 10). Similarly, the terminal voltage of the battery cell 10 at the start of the period Th is higher than the terminal voltage of the battery cell 10 at the end of the period Tg by an amount corresponding to the voltage drop by the internal resistance of the battery cell 10. The terminal voltage of the battery cell 10 at the start of the period Ti is lower than the terminal voltage of the battery cell 10 at the end of the period Th by an amount corresponding to the voltage drop by the internal resistance of the battery cell 10.

Here, a case is considered in which the temperature of the battery cell 10 changes in the periods Tf-Ti. In the present embodiment, as shown in FIG. 9(c), a case is considered where the temperature of the battery cell 10 is maintained at TA during the periods Tf and Tg, the temperature of the battery cell 10 is reduced from TA to TB in the period Th, and the temperature of the battery cell 10 is maintained at TB during the period Ti.

In this case, even if the battery cell 10 is not charged or discharged in the period Th, the terminal voltage of the battery cell 10 at the start of the period Ti is reduced from the terminal voltage of the battery cell 10 at the end of the period Tg. Then, in the period Ti, with the discharging, the terminal voltage of the battery cell 10 is reduced. Here, even when the terminal voltage of the battery cell 10 reaches the discharge termination voltage, the combined SOCt of the battery cell 10 is greater than 0%. In the present embodiment, as shown in FIG. 9(d) by a solid line L1, when the terminal voltage of the battery cell 10 reaches the discharge termination voltage, the combined SOCt is at, for example, 30%.

In consideration of this, the calculation processor 300 calculates the display SOCd to be output to the output unit 140 in addition to the combined SOCt. As shown by a dot-and-chain line L2 in FIG. 9(d), the display SOCd is calculated to become, for example, 0% when the terminal voltage of the battery cell 10 reaches the discharge termination voltage. Similarly, the display SOCd is calculated to become, for example, 100% when the terminal voltage of the battery cell 10 reaches the charge termination voltage. The display SOCd is calculated by the following Equation (6). In Equation (6), $\kappa 1$ is a weight coefficient (fourth weight coefficient) similar to the weight coefficient $\alpha$ in Equation (2). That is, a value of the weight coefficient $\kappa 1$ is set, and one of the SOCi2 and SOCv2 having a lower error is suitably selected, to calculate suitable display SOCd. The calculated display SOCd is stored in the storage unit 340 of the calculation processor 300. The present embodiment will be described with a weight coefficient $(1-\kappa 1)$ as an example of a third weight coefficient and the weight coefficient $\kappa 1$ as an example of the fourth weight coefficient. In the present embodiment, the sum of the third and fourth weight coefficients is set to 1, but the present invention is not limited to such a configuration, and the sum of the third and fourth weight coefficients may be set to a number other than 1.

$$SOCd(t) = (1-\kappa 1) \times SOCi2(t) + \kappa 1 \times SOCv2(t) \ [\%]- \qquad (6)$$

The SOCi2 is an SOC calculated based on an integrated value of the current. In the following, the SOCi2 of the Equation (6) will be called a current-based SOCi2. The SOCi2 is given by the following Equation (7). Similar to the Equations (4) and (5), SOCt(t-1) is the combined SOCt at the time (t-1) in which the SOCt is previously calculated, $\Sigma I$ is the integrated amount of current from (t-1), which is a predetermined period earlier, to the time t, and $\beta 2$ is a charge/discharge coefficient similar to the charge/discharge coefficient $\beta$ of the Equations (4) and (5).

$$SOCi2(t) = SOCt(t-1) + \beta 2 \times \Sigma I/FCC \ [\%]- \qquad (7)$$

The SOCV2(t) is an SOC calculated based on the open circuit voltage. In the following, the SOCv2 of the Equation (6) will be called a voltage-based SOCv2. When the SOCv of the battery cell 10 is lower than a first SOCt threshold S1, the SOCv2 is given by the following Equation (8). When the SOCv of the battery cell 10 is greater than a second SOCt threshold S2, the SOCv2 is given by the following Equation (9). When the SOCv of the battery cell 10 is greater than or equal to the first SOCt threshold S1 and less than or equal to the second SOCt threshold S2, the SOCv2 is given by the following Equation (10). Here, the first SOCt threshold S1 and the second SOCt threshold S2 are set in a similar manner as the first SOCt threshold S1 and the second SOCt threshold S2 in the third setting example of the weight coefficients. That is, when the battery system 500 is equipped in the electric vehicle, the first SOCt threshold S1 is set, for example, at 25%, and the second SOCt threshold S2 is set, for example, at 75%. When the battery system 500 is equipped in an electricity storage device, the first SOCt threshold S1 is set, for example, at 40%, and the second SOCt threshold S2 is set, for example, at 60%. γ is called a correction coefficient.

$$SOCv2(t)=Y\times(SOCv(t)-S1)+S1 \text{ [when } SOCv<S1\text{]}- \quad (8)$$

$$SOCv2(t)=Y\times(SOCv(t)-S2)+S2 \text{ [when } SOCv>S2\text{]}- \quad (9)$$

$$SOCv2(t)=Y\times(SOCv(t)-S1)+S1 \text{ [when } S1\leq SOCv\leq S2\text{]}- \quad (10)$$

The calculation processor 300 sets the charge/discharge coefficient β2 and the correction coefficient γ such that the display SOCd is, for example, 0% when the terminal voltage of the battery cell 10 reaches the discharge termination voltage, based on the current detected by the current detection unit 110, the temperature detected by the temperature detection unit 130, and the combined SOCt which is previously calculated. A setting example of the charge/discharge coefficient β2 and the correction coefficient Y will be described later in a section "(2) Charge/Discharge Coefficient and Setting Example of Charge/Discharge Coefficient".

The calculation processor 300 also sets the charge/discharge coefficient β2 and the correction coefficient Y such that the display SOCd is, for example, 100% when the terminal voltage of the battery cell 10 reaches the charge termination voltage, based on the current detected by the current detection unit 110, the temperature detected by the temperature detection unit 130, and the combined SOCt which is previously calculated. The output unit 140 of FIG. 1 outputs in addition to the weight coefficients κ1 and (1−κ1) the display SOCd, the charge/discharge coefficient β2, and the correction coefficient γ calculated by the calculation processor 300, as display of text or the like.

The SOCi2 is an SOCi which is calculated so that the display SOCd is set, when the terminal voltage of the battery cell 10 reaches the discharge termination voltage, to, for example, 0%, without causing the user of the battery system 500 to feel unnatural. The SOCi2 is also an SOCi which is calculated so that the display SOCd is set, when the terminal voltage of the battery cell 10 reaches the charge termination voltage, to, for example, 100%, without causing the user of the battery system 500 to feel unnatural. In the range of greater than or equal to the first SOCt threshold S1 and less than or equal to the second SOCt threshold S2, the terminal voltage of the battery cell 10 does not rapidly reach the discharge termination voltage or the charge termination voltage. Therefore, in the range of greater than or equal to the first SOCt threshold S1 and less than or equal to the second SOCt threshold S2, the SOCi2 is calculated to be equal to the SOCi.

Similarly, the SOCv2 is an SOCv which is calculated such that the display SOCd is set, when the terminal voltage of the battery cell 10 reaches the discharge termination voltage, to 0%, without causing the user of the battery system 500 to feel unnatural. In addition, the SOCv2 is an SOCv which is calculated such that the display SOCd is set, when the terminal voltage of the battery cell 10 reaches the charge termination voltage, to 100%, without causing the user of the battery system 500 to feel unnatural. In the range of greater than or equal to the first SOCt threshold S1 and less than or equal to the second SOCt threshold S2, the terminal voltage of the battery cell 10 does not rapidly reach the discharge termination voltage or the charge termination voltage. Therefore, in the range of greater than or equal to the first SOCt threshold S1 and less than or equal to the second SOCt threshold S2, the SOCv2 is calculated to be equal to the SOCv.

Figure 10:
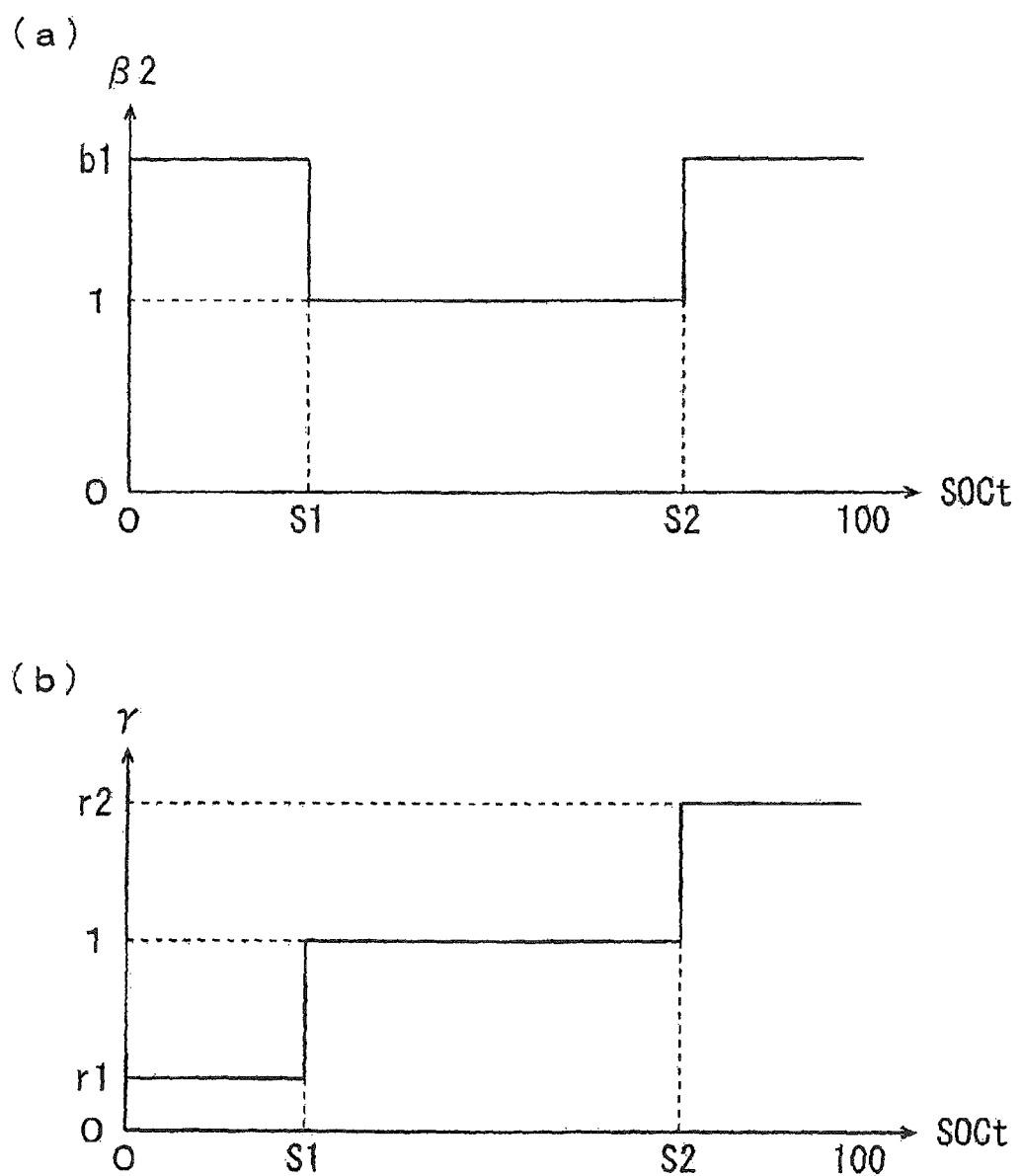
FIG. 10 is a diagram showing an example relationship among a combined SOCt, a charge/discharge coefficient, and a correction coefficient in a case where a charge/discharge rate of a battery cell is higher than a reference charge/discharge rate.

(2) Charge/Discharge Coefficient and Setting Example of Charge/Discharge Coefficient In the following, the charge rate and the discharge rate will be generally called a "charge/discharge rate", and the reference charge rate and the reference discharge rate will be generally called a "reference charge/discharge rate". FIG. 10 is a diagram showing an example of a relationship among the combined SOCt, the charge/discharge coefficient β2, and the correction coefficient γ in a case where the charge/discharge rate of the battery cell 10 is higher than the reference charge/discharge rate. FIG. 10(a) shows a relationship between the combined SOCt of the battery cell 10 and the charge/discharge coefficient β2. In FIG. 10(a), the horizontal axis represents the combined SOCt and the vertical axis represents the charge/discharge coefficient β2. FIG. 10(b) shows a relationship between the combined SOCt of the battery cell 10 and the correction coefficient Y. In FIG. 10(b), the horizontal axis represents the combined SOCt and the vertical axis represents the correction coefficient γ.

As shown in FIGS. 10(a) and 10(b), in a range where the combined SOCt of the battery cell 10 is lower than the first SOCt threshold S1, the charge/discharge coefficient β2 is set to maintain a value b1 which is greater than 1, and the correction coefficient Y is set to maintain a value r1 which is smaller than 1. In a range where the combined SOCt of the battery cell 10 is greater than or equal to the first SOCt threshold S1 and less than or equal to the second SOCt threshold S2, the charge/discharge coefficient β2 is set to maintain 1, and the correction coefficient Y is set to maintain 1. In a range where the combined SOCt of the battery cell 10 is greater than the second SOCt threshold S2, the charge/discharge coefficient β2 is set to maintain a value b1 which is greater than 1, and the correction coefficient Y is set to maintain a value r2 which is greater than 1.

Referring again to FIG. 9(d), as described above, even when the terminal voltage of the battery cell 10 reaches the discharge termination voltage, the combined SOCt of the battery cell 10 is greater than 0%. In the example configuration of FIG. 9(d), as shown by the solid line L1, the combined SOCt when the terminal voltage of the battery cell 10 reaches the discharge termination voltage is, for example, 30%. Even in such a case, as shown in the example configuration of FIG. 10, the charge/discharge coefficient β2 and the correction coefficient Y are set based on the combined SOCt so that the rate of change (slope of the dot-and-chain line L2 in FIG. 9(d)) of the display SOCd is adjusted in the case where the charge/discharge rate is higher than the reference charge/discharge rate.

Figure 11:
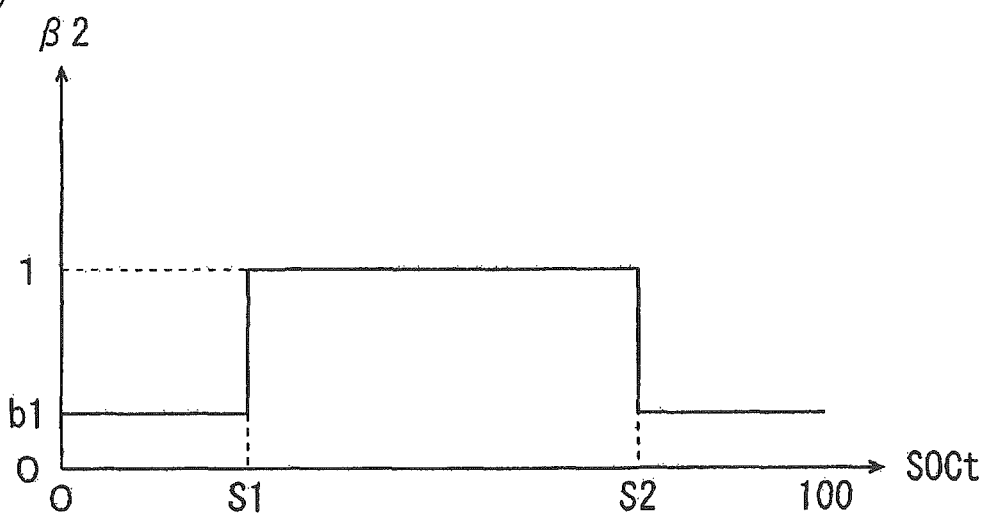
FIG. 11 is a diagram showing an example relationship among a combined SOCt, a charge/discharge coefficient, and a correction coefficient in a case where a charge/discharge rate of a battery cell is lower than a reference charge/discharge rate.
Figure 11:
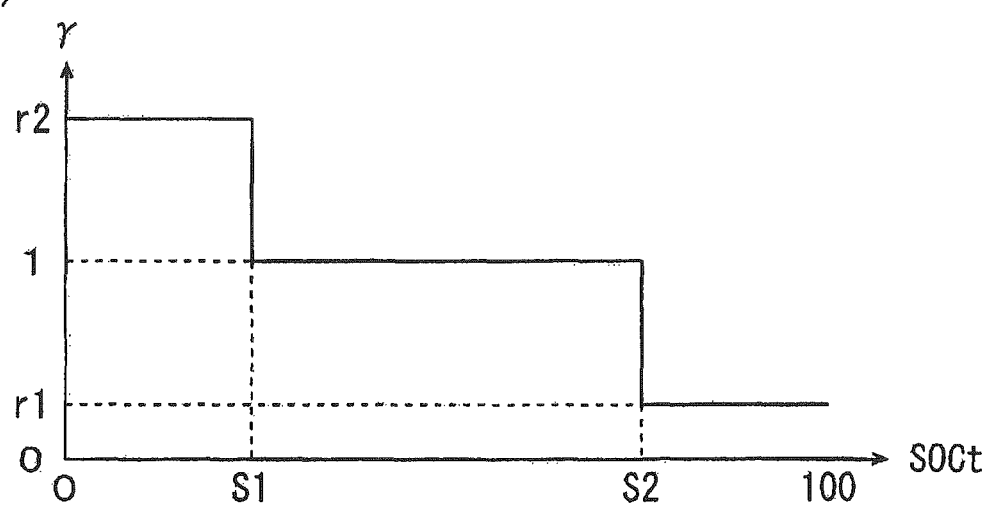

FIG. 11 is a diagram showing an example relationship among the combined SOCt, the charge/discharge coefficient β, and the correction coefficient Y in the case where the charge/discharge rate of the battery cell 10 is lower than the reference charge/discharge rate. FIG. 11(a) shows a relationship between the combined SOCt of the battery cell 10 and the charge/discharge coefficient β2. In FIG. 11(a), the horizontal axis represents the combined SOCt and the vertical axis represents the charge/discharge coefficient β2. FIG. 11(b) shows a relationship between the combined SOCt of the battery cell 10 and the correction coefficient Y. In FIG. 11(b), the horizontal axis represents the combined SOCt and the vertical axis represents the correction coefficient Y.

As shown in FIGS. 11(a) and 11(b), in a range where the combined SOCt of the battery cell 10 is lower than the first SOCt threshold S1, the charge/discharge coefficient β2 is set to maintain a value b1 which is smaller than , and the correction coefficient Y is set to maintain a value r2 which is greater than 1. In a range where the combined SOCt of the battery cell 10 is greater than or equal to the first SOCt threshold S1 and less than or equal to the second SOCt threshold S2, the charge/discharge coefficient β2 is set to maintain 1, and the correction coefficient Y is set to maintain 1. In a range where the combined SOCt of the battery cell 10 is greater than the second SOCt threshold S2, the charge/discharge coefficient β2 is set to maintain a value b1 which is smaller than b1, and the correction coefficient Y is set to maintain a value r1 which is smaller than 1.

With reference to FIG. 9(d), as described above, when the terminal voltage of the battery cell 10 reaches the discharge termination voltage, the combined SOCt of the battery cell 10 is greater than 0%. In the example configuration of FIG. 9(d), as shown by the solid line L1, the combined SOCt when the terminal voltage of the battery cell 10 reaches the discharge termination voltage is, for example, 30%. Even in such a case, the charge/discharge coefficient β2 and the correction coefficient Y are set based on the combined SOCt as in the example of FIG. 11, so that the rate of change of the display SOCd is adjusted in the case where the charge/discharge rate is lower than the reference charge/discharge rate.

The value of the SOC during charging and discharging depends on the temperature of the battery cell 10 and the current flowing in the battery cell 10. Because of this, the above-described value of b1 for the charge/discharge coefficient β2 is preferably adjusted in consideration of the temperature of the battery cell 10 and the current flowing in the battery cell 10.

Figure 12:
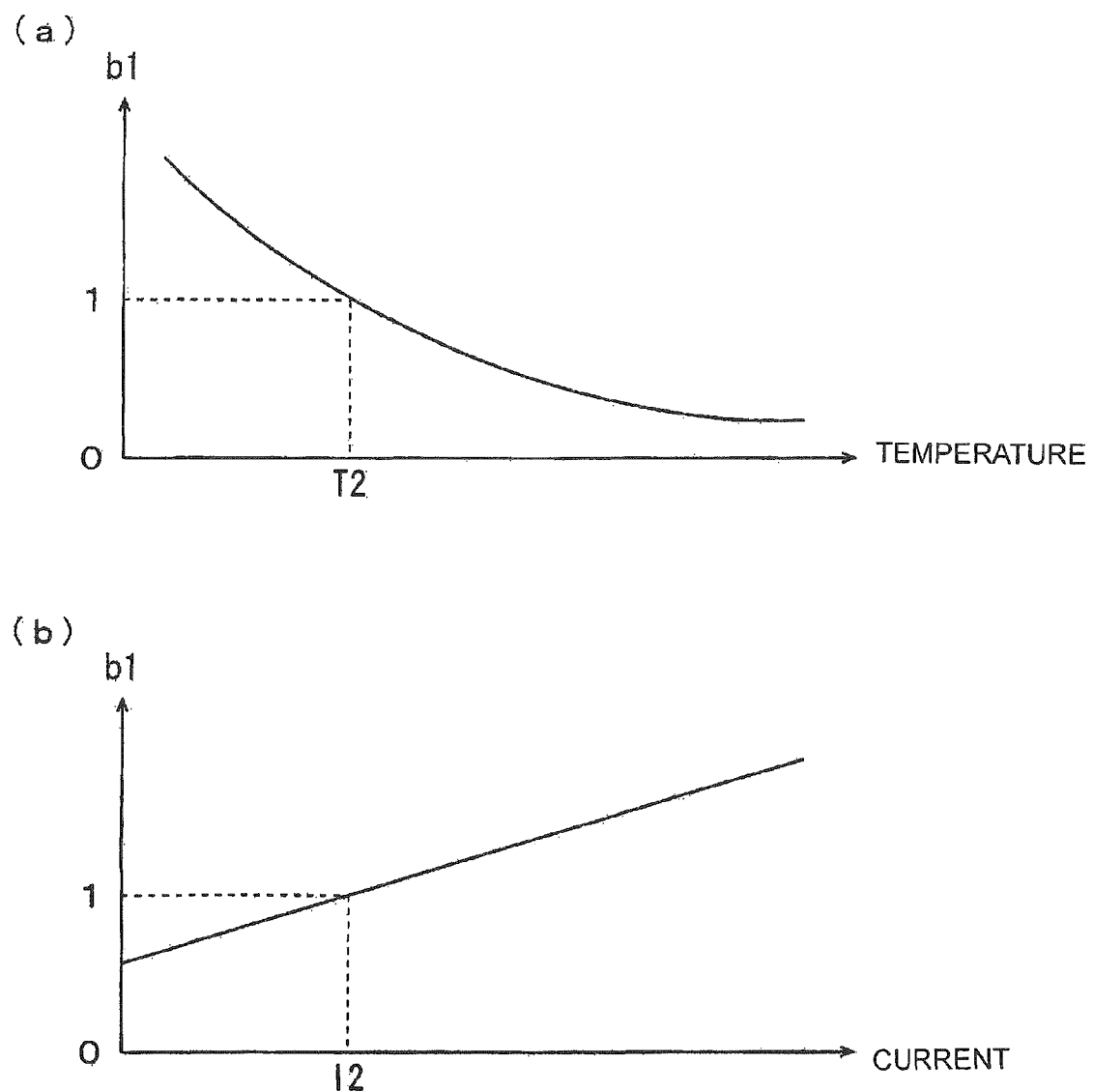
FIG. 12 is a diagram showing an example relationship among a temperature detected by a temperature detection unit, a current detected by a current detection unit, and a charge/discharge coefficient.

FIG. 12 is a diagram showing an example relationship among the temperature detected by the temperature detection unit 130, the current detected by the current detection unit 110, and the value b1 for the charge/discharge coefficient β2. In FIG. 12(a), the horizontal axis represents the temperature detected by the temperature detection unit 130. The vertical axis represents the value b1 for the charge/discharge coefficient β2 (refer to FIGS. 10 and 11) when the combined SOCt of the battery cell 10 is lower than the first SOCt threshold S1 or is greater than the second SOCt threshold S2. In FIG. 12(b), the horizontal axis represents the current detected by the current detection unit 110. The vertical axis represents the value b1 for the charge/discharge coefficient β2 (refer to FIGS. 10 and 11) when the combined SOCt of the battery cell 10 is lower than the first SOCt threshold S1 or is greater than the second SOCt threshold S2.

As shown in FIG. 12(a), the value b1 is set to decrease as the temperature increases. Here, the value of b1 is set to 1 when the temperature detected by the temperature detection unit 130 is a temperature threshold T2 which is set in advance. When the temperature detected by the temperature detection unit 130 is lower than the temperature threshold T2, the value of b1 is set to be greater than 1. When the temperature detected by the temperature detection unit 130 is greater than the temperature threshold T2, the value of b1 is set to be less than 1.

As shown in FIG. 12(b), the value b1 is set to increase as the current increases. Here, the value b1 is set to 1 when the current detected by the current detection unit 110 is a current threshold I2 which is set in advance. When the current detected by the current detection unit 110 is lower than the current threshold I2, the value of b1 is set to be less than 1. When the current detected by the current detection unit 110 is greater than the current threshold I2, the value b1 is set to be greater than 1.

In this manner, the value b1 for the charge/discharge coefficient β2 is adjusted during the discharging of the battery cell 10 based on the temperature of the battery cell 10 and the current flowing in the battery cell 10, so that the display SOCd can be changed to accurately show, for example, 0% when the terminal voltage of the battery cell 10 reaches the discharge termination voltage.

Similarly, the value b1 for the charge/discharge coefficient β2 is adjusted during the charging of the battery cell 10 based on the temperature of the battery cell 10 and the current flowing in the battery cell 10, so that the display SOCd can be changed to accurately show, for example, 100% when the terminal voltage of the battery cell 10 reaches the charge termination voltage.

(3) Structure for Calculating Display SOCd

Figure 13:
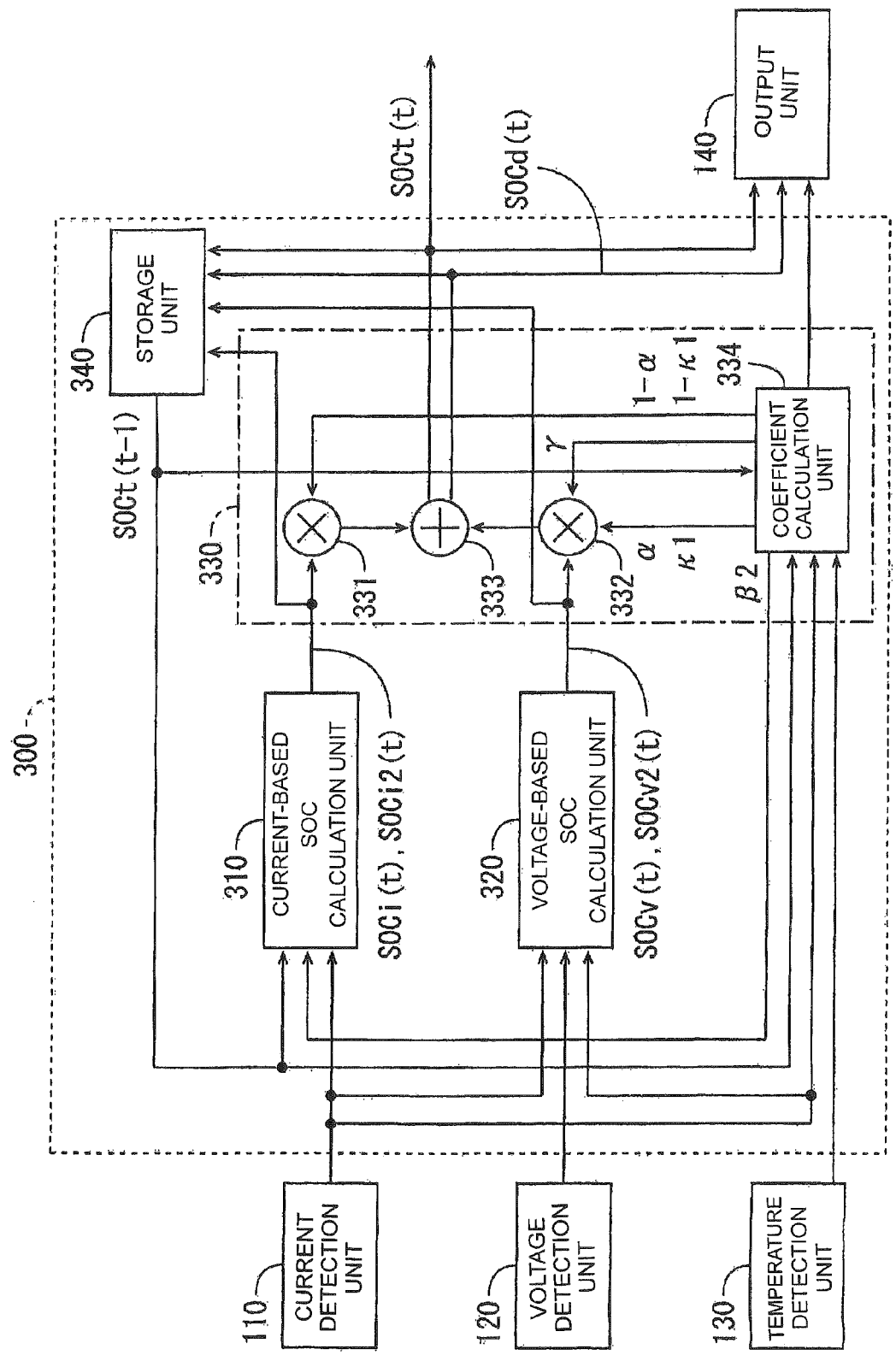
FIG. 13 is a block diagram showing a detailed structure of a calculation processor that calculates a display SOCd.

FIG. 13 is a block diagram showing a detailed structure of the calculation processor 300 for calculating the display SOCd. The structure of the calculation processor 300 of FIG. 13 is similar to the structure of the calculation processor 300 of FIG. 8 except for the process of a coefficient calculation unit 334. The calculation processor 300 of FIG. 13 executes the following process for calculating the display SOCd in addition to the processes of the calculation processor 300 of FIG. 8.

As shown in FIG. 13, the coefficient calculation unit 334 of the combined SOC calculation unit 330 determines the weight coefficients α and (1−α) similar to the calculation processor 300 of FIG. 8. In addition, the coefficient calculation unit 334 of the combined SOC calculation unit 330 determines the weight coefficient κ1 and (1−κ1). Moreover, the coefficient calculation unit 334 determines the charge/discharge coefficient β2 and the correction coefficient Y based on at least one of the current detected by the current detection unit 110 and the temperature detected by the temperature detection unit 130, and the combined SOCt(t-1) at a time (t-1) (combined SOCt calculated at time (t-1) which is a previous time from the time t1).

The current-based SOC calculation unit 310 calculates the SOCi2(t) at time t using the Equation (7) based on the current detected by the current detection unit 110, the combined SOCt which is previously measured, and the charge/discharge coefficient β2 determined by the coefficient calculation unit 334. The calculated SOCi2(t) is stored in the storage unit 340.

The voltage-based SOC calculation unit 320 calculates the SOCv2(t) at the time t using Equation (8), (9), or (10) based on the calculated SOCv(t) and the correction coefficient Y determined by the coefficient calculation unit 334. The calculated SOCv2(t) is stored in the storage unit 340.

The multiplier 331 multiplies the SOCi2(t) calculated by the current-based SOC calculation unit 310 and the weight coefficient (1−κ1) determined by the coefficient calculation unit 334, to calculate the weighted SOCi2(t) (=(1−κ1)× SOCi2(t)). Similarly, the multiplier 332 multiplies the SOCv2(t) calculated by the voltage-based SOC calculation unit 320 and the weight coefficient κ1 determined by the coefficient calculation unit 334, to calculate the weighted SOCv2(t) (=κ1×SOCv2(t)). The weighted SOCi2(t) calculated by the multiplier 331 and the weighted SOCv2(t) calculated by the multiplier 332 are added, to calculate the display SOCd(t).

The display SOCd(t) calculated by the adder 333 is stored in the storage unit 340. In addition, the display SOCd(t) calculated by the adder 333, and the weight coefficient κ1, the charge/discharge coefficient β, and the correction coefficient Y which are determined by the coefficient calculation unit 334 are output to the output unit 140.

(4) Advantages

The calculation processor 300 which is a state-of-charge calculation unit comprises the current-based SOC calculation unit 310 which is a third state-of-charge calculation unit, the voltage-based SOC calculation unit 320 which is a fourth state-of-charge calculation unit, and the combined SOC calculation unit 330 which is an output state-of-charge calculation unit. The current-based SOC calculation unit 310 calculates the SOC which is the state of charge of the battery cell 10 based on the current flowing in the battery cell 10 as the SOCi2 which is a third state of charge. The voltage-based SOC calculation unit 320 calculates the SOC which is a state of charge of the battery cell 10 based on the terminal voltage of the battery cell 10 as the SOCv2 which is a fourth state of charge. The combined SOC calculation unit 330 respectively weights the SOCi2 calculated by the current-based SOC calculation unit 310 and the SOCv2 calculated by the voltage-based SOC calculation unit 320 with the weight coefficient (1−κ1) which is the third weight coefficient and the weight coefficient κ1 which is the fourth weight coefficient, and combines the weighted SOCi2 and the weighted SOCv2, to calculate the display SOCd which is the output state of charge. In addition, the combined SOC calculation unit 330 continuously changes at least one of the SOCi2 calculated by the current-based SOC calculation unit 310 and the SOCv2 calculated by the voltage-based SOC calculation unit 320 so that the display SOCd is set to, for example, 0% which is a lower limit value when the terminal voltage of the battery cell 10 reaches the discharge termination voltage, and the display SOCd is set to, for example, 100% which is an upper limit value when the termination voltage of the battery cell 10 reaches the charge termination voltage.

In this case, the combined SOC calculation unit 330 can suitably display the SOC. In addition, the user of the battery system 500 can recognize that the SOC has reached, for example, 0% when the terminal voltage of the battery cell 10 reaches the discharge termination voltage, without feeling unnatural. Similarly, the user of the battery system 500 can recognize that the SOC has reached, for example, 100% when the voltage of the battery cell 10 reaches the charge termination voltage, without feeling unnatural. Moreover, the user of the battery system 500 can recognize the change of the SOC of the battery cell 10 based on the display SOCd.

The output unit 140 of FIG. 1 may output the output state of charge (display SOCd) calculated by the output state-of-charge calculation unit (combined SOC calculation unit 330).

(5) Alternative Configuration

Figure 14:
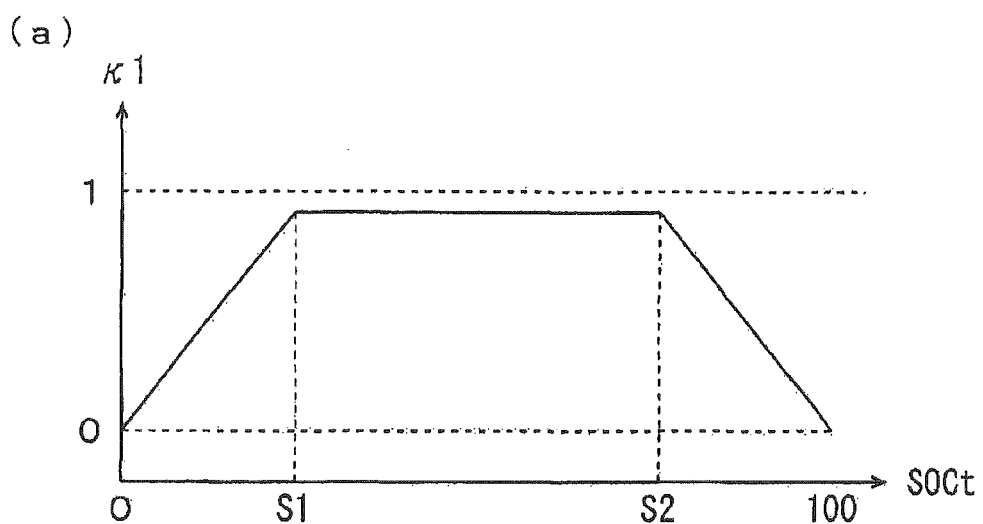
FIG. 14 is a diagram showing a relationship between a combined SOCt of a battery cell and a weight coefficient in an alternative configuration of a third preferred embodiment of the present invention.
Figure 14:
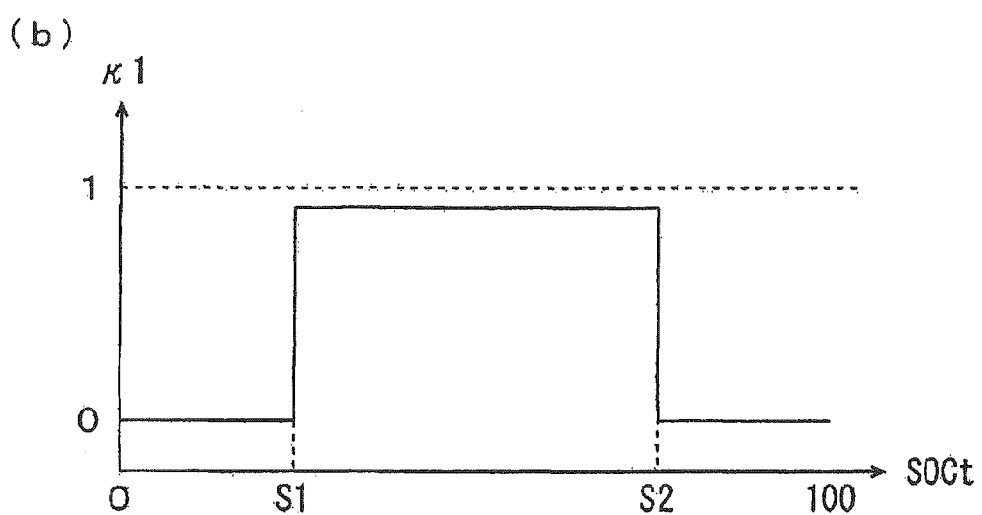

When the battery system 500 is used primarily in the range where the combined SOCt of the battery cell 10 is greater than or equal to the first SOCt threshold S1 and less than or equal to the second SOCt threshold S2, the weight coefficient κ1 may alternatively be set in the following manner. FIG. 14 is a diagram showing a relationship between the combined SOCt of the battery cell 10 and the weight coefficient κ1 in an alternative configuration of the third preferred embodiment of the present invention. In FIGS. 14(a) and 14(b), the horizontal axis represents the combined SOCt and the vertical axis represents the weight coefficient κ1. The combined SOCt of FIGS. 14(a) and 14(b) is the combined SOCt which is previously calculated, and is stored in the storage unit 340 of the calculation processor 300.

As shown in FIG. 14(a), when the combined SOCt of the battery cell 10 is greater than or equal to the first SOCt threshold S1 and less than or equal to the second SOCt threshold S2, the weight coefficient κ1 is set constant at a relatively high value (for example, 0.9). With this configuration, in the above-described Equation (6), the display SOCd(t) approximately coincides with the SOCv. As a result, the display SOCd(t) becomes approximately equal to the actual SOC of the battery cell 10.

In the case where the combined SOCt of the battery cell 10 is lower than the first SOCt threshold S1, the weight coefficient κ1 is set to increase with an increase of the combined SOCt. When the combined SOCt of the battery cell 10 is greater than the second SOCt threshold S2, the weight coefficient κ1 is set to decrease with the increase of the combined SOCt. With this configuration, the charge/discharge coefficient β2 and the correction coefficient Y are adjusted, so that the calculation processor 300 can change the display SOCd to show, for example, 0% when the terminal voltage of the battery cell 10 reaches the discharge termination voltage and to show, for example, 100% when the terminal voltage of the battery cell 10 reaches the charge termination voltage.

As shown in FIG. 14(b), in the case where the combined SOCt of the battery cell 10 is greater than or equal to the first SOCt threshold S1 and less than or equal to the second SOCt threshold S2, the weight coefficient κ1 is set constant at a relatively high value (for example, 0.9). With this configuration, in the above-described Equation (6), the display SOCd(t) approximately coincides with the SOCv. As a result, the display SOCd(t) becomes approximately equal to the actual SOC of the battery cell 10.

In the cases where the combined SOCt of the battery cell 10 is lower than the first SOCt threshold S1 and where the combined SOCt of the battery cell 10 is greater than the second SOCt threshold S2, the weight coefficient κ1 is set to 0. In this case, the correction coefficient Y in Equations (8), (9), and (10) is set to 1. With this configuration, the charge/discharge coefficient β2 is adjusted and the calculation processor 300 can change the display SOCd so that the display SOCd shows, for example, 0% when the terminal voltage of the battery cell 10 reaches the discharge termination voltage and the display SOCd shows, for example, 100% when the terminal voltage of the battery cell 10 reaches the charge termination voltage.

[4] Fourth Preferred Embodiment

A battery system 500 according to a fourth preferred embodiment of the present invention will now be described in relation to a difference from the battery system 500 of the third preferred embodiment of the present invention.

(1) Charging or Discharging after Reset of Display SOCd

The calculation processor 300 sets the display SOCd to, for example, 0% when the terminal voltage of the battery cell 10 reaches the discharge termination voltage. Then, when the battery cell 10 is charged, for the user of the battery system 500, it is preferable that the display SOCd smoothly approaches the combined SOCt which is the true SOC, because, if the display SOCd rapidly approaches the combined SOCt, the user of the battery system 500 would feel unnatural. Similarly, the calculation processor 300 sets the display SOCd to, for example, 100% when the terminal voltage of the battery cell 10 reaches the charge termination voltage. Then, when the battery cell 10 is discharged, for the user of the battery system 500, it is preferable that the display SOCd smoothly approaches the combined SOCt which is the true SOC, because, if the display SOCd rapidly approaches the combined SOCt, the user of the battery system 500 would feel unnatural.

In the following, the setting of the display SOCd to, for example, 0% when the terminal voltage of the battery cell 10 reaches the discharge termination voltage and the setting of the display SOCd to, for example, 100% when the terminal voltage of the battery cell 10 reaches the charge termination voltage will be called reset of the display SOCd. After the reset of the display SOCd, the calculation processor 300 calculates the display SOCd based on the following Equation (11). In Equation (11), $\kappa 2$ is a weight coefficient similar to the weight coefficient $\alpha$ of the Equation (2). That is, the value of the weight coefficient $\kappa 2$ is set and one of SOCi3 and SOCv having a smaller error is suitably selected, to calculate suitable display SOCd. The calculated display SOCd is stored in the storage unit 340 of the calculation processor 300. The present embodiment will be described with a weight coefficient $(1-\kappa 2)$ as an example of a fifth weight coefficient and the weight coefficient $\kappa 2$ as an example of a sixth weight coefficient. In the present embodiment, the sum of the fifth and sixth weight coefficients is set to 1, but the present invention is not limited to such a configuration. Alternatively, the sum of the fifth and sixth weight coefficients may be set to a number other than 1.

$$SOCd(t)=(1-\kappa 2)\times SOCi3(t)+\kappa 2\times SOCv(t) \ [\%]- \quad (11)$$

The SOCi3 is an SOC calculated based on an integrated value of the current. In the following, the SOCi3 of the Equation (11) will be called a current-based SOCi3. The SOCi3 is given by the following Equation (12). In Equation (12), the SOCd(t-1) is the display SOCd at a time (t-1) in which the SOCd is previously calculated, $\Sigma I$ is the integrated amount of current from time (t-1) which is a predetermined period earlier, to time t, and FCC is the fully charged current capacity.

$$SOCi3(t)=SOCd(t-1)+\Sigma I/FCC \ [\%]- \quad (12)$$

When the actual charge rate or the actual discharge rate of the battery cell 10 differs from the reference charge rate or the reference discharge rate, the SOCi3 is calculated by the following Equation (12') in place of the Equation (12). Here, $\beta$ is a charge/discharge coefficient similar to the Equations (4') and (5).

$$SOCi3(t)=SOCd(t-1)+\beta\times\Sigma I/FCC \ [\%]- \quad (12')$$

Figure 15:
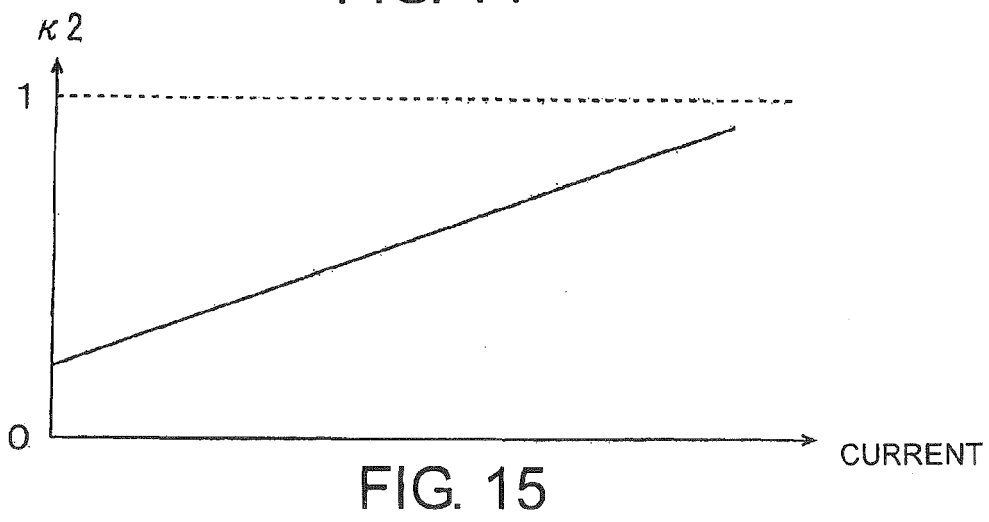
FIG. 15 is a diagram showing a relationship between a current detected by a current detection unit and a weight coefficient after reset of a display SOCd.

FIG. 15 is a diagram showing a relationship between the current detected by the current detection unit 110 after the reset of the display SOCd and the weight coefficient $\kappa 2$. In FIG. 15, the horizontal axis represents the current detected by the current detection unit 110 and the horizontal axis represents the weight coefficient $\kappa 2$. As shown in FIG. 15, the weight coefficient $\kappa 2$ is set to increase with an increase of the current, because the change of the SOCi3 is large when the current detected by the current detection unit 110 is large. In this case, because the SOCi3 rapidly changes, if the weight coefficient $\kappa 2$ is large, the percentage of the SOCi3 in the display SOCd becomes large, and the display SOCd would rapidly change. In order to prevent this, the weight coefficient $\kappa 2$ is set to increase with the increase of the current.

(2) Advantages

When the terminal voltage of the battery cell 10 reaches the charge termination voltage, the display SOCd is set to, for example, 100%. Then, when the battery cell 10 is discharged, the calculation processor 300 causes the display SOCd to smoothly approach the combined SOCt. Here, when the terminal voltage of the battery cell 10 reaches the charge termination voltage, as shown in FIG. 2, the change of SOC with respect to the change of the open circuit voltage of the battery cell 10 is small, and thus, the voltage-based SOC calculation unit 320 can precisely obtain the SOCv. Because of this, the calculation processor 300 causes the display SOCd to smoothly approach the SOCv. The actual SOCv when the terminal voltage of the battery cell 10 reaches the charge termination voltage is, for example, less than 100%, and is, for example, about 70%.

When the current detected by the current detection unit 10 is large, the change of the SOCi3 calculated by the Equation (12) or (12') is large. That is, the SOCi3 rapidly decreases from, for example, 100%. On the other hand, when the current detected by the current detection unit 110 is small, the change of the SOCi3 calculated by the Equation (12) or (12') is small. In other words, the SOCi3 does not rapidly decrease from, for example, 100%.

In consideration of this, as shown in FIG. 15, the weight coefficient $\kappa 2$ is set to increase as current detected by the current detection unit 110 increases. With this configuration, the percentage of the SOCv becomes large as the current becomes large. As a result, the calculation processor 300 can cause the SOCd to smoothly approach from, for example, 100% to the SOCv without causing the user of the battery system 500 to feel unnatural.

Similarly, when the terminal voltage of the battery cell 10 reaches the discharge termination voltage, the display SOCd is set to, for example, 0%. Then, when the battery cell 10 is charged, the calculation processor 300 causes the display SOCd to smoothly approach the combined SOCt. Here, when the terminal voltage of the battery cell 10 reaches the discharge termination voltage, as shown in FIG. 2, because the change of the SOC with respect to the change of the open circuit voltage of the battery cell 10 is small, the voltage-based SOC calculation unit 320 can precisely obtain the SOCv. Thus, the calculation processor 300 causes the display SOCd to smoothly approach the SOCv. The actual SOCv when the terminal voltage of the battery cell 10 reaches the discharge termination voltage is, for example, greater than 0%, and is, for example, about 30%.

When the current detected by the current detection unit 110 is large, the change of the SOCi3 calculated by the Equation (12) or (12') is large. That is, the SOCi3 rapidly increases from, for example, 0%. On the other hand, when the current detected by the current detection unit 110 is small, the change of the SOCi3 calculated by the Equation (12) or (12') is small. That is, the SOCi3 does not rapidly increase from, for example, 0%.

In consideration of this, as shown in FIG. 15, the weight coefficient $\kappa 2$ is set to increase as the current detected by the current detection unit 110 increases. With this configuration, as the current becomes large, the percentage of the SOCv becomes large. As a result, the calculation processor 300 can cause the display SOCd to smoothly approach from, for example, 0% to the SOCv without causing the user of the battery system 500 to feel unnatural.

[5] Fifth Preferred Embodiment

As a movable structure according to a fifth preferred embodiment of the present invention, an electric vehicle and other movable structures will now be described. The movable structure of the present embodiment comprises the battery system 500 according to any one of the first through fourth preferred embodiments of the present invention.

(1) Structure and Operation of Electric Vehicle

Figure 16:
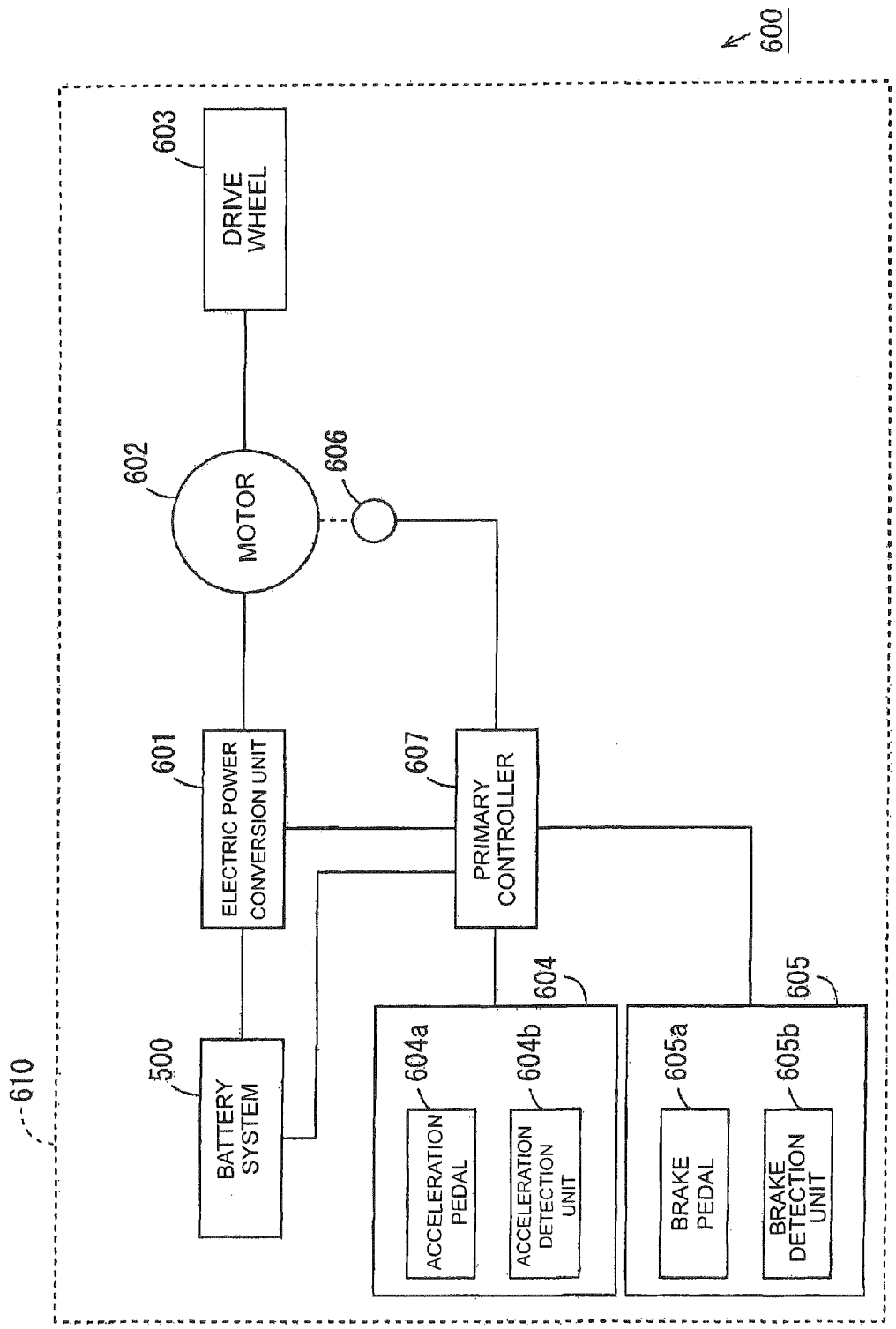
FIG. 16 is a block diagram showing a structure of an electricity-driven automobile having a battery system.

As an example of an electric vehicle according to the fifth preferred embodiment, an electricity-driven automobile will be described. FIG. 16 is a block diagram showing a structure of an electricity-driven automobile having the battery system 500. As shown in FIG. 16, an electricity-driven automobile 600 comprises a vehicle body 610. In the vehicle body 610, the battery system 500, an electric power converter 601, a motor 602, a drive wheel 603, an acceleration device 604, a brake device 605, a rotational velocity sensor 606, and a primary controller 607 are provided. When the motor 602 is an alternating current (AC) motor, the electric power converter 601 includes an inverter circuit.

The battery system 500 is connected to the motor 602 via the electric power converter 601 and also to the primary controller 607. To the primary controller 607, a state of charge of each battery cell 10 (in the examples of the first through fourth preferred embodiments, the combined SOCt) of the battery module 100 (refer to FIG. 1) is supplied from the calculation processor 300 (refer to FIG. 1) which is a part of the battery system 500. In addition, the acceleration device 604, the brake device 605, and the rotational velocity sensor 606 are connected to the primary controller 607. The primary controller 607 is formed with, for example, a CPU and a memory, or a microcomputer.

The acceleration device 604 includes an acceleration pedal 604a of the electricity-driven automobile 600 and an acceleration detection unit 604b which detects an amount of operation (an amount of stepping-in) of the acceleration pedal 604a. When the acceleration pedal 604a is operated by a driver, the acceleration detection unit 604b detects the amount of operation of the acceleration pedal 604a with reference to a state where the acceleration pedal 604a is not operated by the driver. The detected amount of operation of the acceleration pedal 604a is supplied to the primary controller 607.

The brake device 605 includes a brake pedal 605a of the electricity-driven automobile 600 and a brake detection unit 605b which detects an amount of operation (an amount of stepping-in) of the brake pedal 605a by the driver. When the brake pedal 605a is operated by the driver, the brake detection unit 605b detects the amount of operation thereof. The detected amount of operation of the brake pedal 605a is supplied to the primary controller 607.

The rotational velocity sensor 606 detects a rotational velocity of the motor 602. The detected rotational velocity is supplied to the primary controller 607.

To the primary controller 607, the state of charge of each battery cell 10 of the battery module 100, the value of current flowing in the battery module 100, the amount of operation of the acceleration pedal 604a, the amount of operation of the brake pedal 605a, and the rotational velocity of the motor 602 are supplied. The primary controller 607 executes the charge/discharge control of the battery module 100 and electric power conversion control of the electric power converter 601 based on these information.

For example, during start of traveling and during acceleration of the electricity-driven automobile 600 based on an acceleration operation, the electric power of the battery module 100 is supplied from the battery system 500 to the electric power converter 601.

In addition, the primary controller 607 calculates a rotational force (command torque) to be transmitted to the drive wheel 603 based on the supplied amount of operation of the acceleration pedal 604a, and supplies a control signal based on the command torque to the electric power converter 601.

The electric power converter 601 receiving the above-described control signal converts the electric power supplied from the battery system 500 into an electric power (drive electric power) necessary for driving the drive wheel 603. In this manner, the drive electric power converted by the electric power converter 601 is supplied to the motor 602, and the rotational force of the motor 602 based on the drive electric power is transmitted to the drive wheel 603.

On the other hand, during deceleration of the electricity-driven automobile 600 based on the brake operation, the motor 602 functions as a power generation device. In this case, the electric power converter 601 converts regenerated electric power generated by the motor 602 into an electric power suitable for charging the battery module 100, and supplies the converted power to the battery module 100. With this configuration, the battery module 100 is charged.

(2) Advantages in Electric Vehicle

The electricity-driven automobile 600 which is the electric vehicle according to the present embodiment comprises the battery system 500, the motor 602 driven by the electric power from the battery cell 10 of the battery system 500, and the drive wheel 603 which is rotated by the rotational force of the motor 602.

In such an electricity-driven automobile 600, the motor 602 is driven by the electric power from the battery system 500. The electricity-driven automobile 600 moves by the drive wheel 603 being rotated by the rotational force of the motor 602.

Because the above-described battery system 500 is used in the electric vehicle, the state of charge of the battery cell 10 can be precisely calculated.

(3) Structure and Operation in Other Movable Structures

The battery system 500 may alternatively be equipped in other movable structures such as a ship, an airplane, an elevator, a walking robot, or the like.

A ship equipped with the battery system 500 comprises, for example, a ship body in place of the vehicle body 610 of FIG. 16, a screw in place of the drive wheel 603 of FIG. 16, an acceleration input unit in place of the acceleration device 604 of FIG. 16, and a deceleration input unit in place of the brake device 605 of FIG. 16. The operator operates the acceleration input unit in place of the acceleration device 604 when the ship body is to be accelerated, and operates the deceleration input unit in place of the brake device 605 when the ship body is to be decelerated. In this case, the ship body corresponds to a movable structure body, the motor corresponds to a motive power source, and the screw corresponds to a drive unit. Alternatively, the deceleration input unit may be omitted in the ship. In this case, the operator operates the acceleration input unit to stop the acceleration of the ship body, and the ship body decelerates due to the resistance of water. In such a structure, the motor receiving the electric power from the battery system 500 converts the electric power into motive power, and the ship body moves by the screw being rotated by the converter motive power.

An airplane equipped with the battery system 500 comprises, for example, an airplane body in place of the vehicle body 610 of FIG. 16, a propeller in place of the drive wheel 603 of FIG. 16, an acceleration input unit in place of the acceleration device 604 of FIG. 16, and a deceleration input unit in place of the brake device 605 of FIG. 16. Alternatively, the deceleration input unit may be omitted in the ship and the airplane. In this case, the operator operates the acceleration input unit to stop the acceleration, and the body is decelerated by resistance of water or resistance of air.

An elevator equipped with the battery system 500 comprises, for example, a car in place of the vehicle body 610 of FIG. 16, an elevating/lowering rope attached to the car in place of the drive wheel 603 of FIG. 16, an acceleration input unit in place of the acceleration device 604 of FIG. 16, and a deceleration input unit in place of the brake device 605 of FIG. 16.

A walking robot equipped with the battery system 500 comprises, for example, a body in place of the vehicle body 610 of FIG. 16, a leg in place of the drive wheel 603 of FIG. 16, an acceleration input unit in place of the acceleration device 604 of FIG. 16, and a deceleration input unit in place of the brake device 605 of FIG. 16.

In these movable structures, the motor corresponds to the motive power source, the ship body, airplane body, car and body correspond to the movable structure body, and the screw, propeller, elevating/lowering rope, and leg correspond to the drive unit. The motive power source receiving the electric power from the battery system 500 converts the electric power into motive power, and the drive unit moves the movable structure body by the motive power converted by the motive power source.

(4) Advantages in Other Movable Structures

The movable structure of the present embodiment comprises the above-described battery system 500, the movable structure body, the motive power source which converts the electric power from the battery cell 10 of the battery system 500 into motive power for moving the movable structure body, and the drive unit which moves the movable structure body by the motive power converted by the motive power source.

In the movable structure, the electric power from the battery system 500 is converted into motive power by the motive power source, and the drive unit moves the movable structure body by the motive power.

Because the above-described battery system 500 is used in the movable structure, the state of charge of the battery cell 10 can be precisely calculated.

(5) Alternative Configuration of Movable Structure

In the electricity-driven automobile 600 of FIG. 16 or the other movable structures, in place of the calculation processor 300 being provided in each battery system 500, the primary controller 607 may alternatively have functions similar to those of the calculation processor 300.

[6] Sixth Preferred Embodiment

A power supply device according to a sixth preferred embodiment of the present invention will now be described. A power supply device according to the present embodiment comprises the battery system 500 according to any one of the first through fourth preferred embodiments of the present invention.

(1) Structure and Operation

Figure 17:
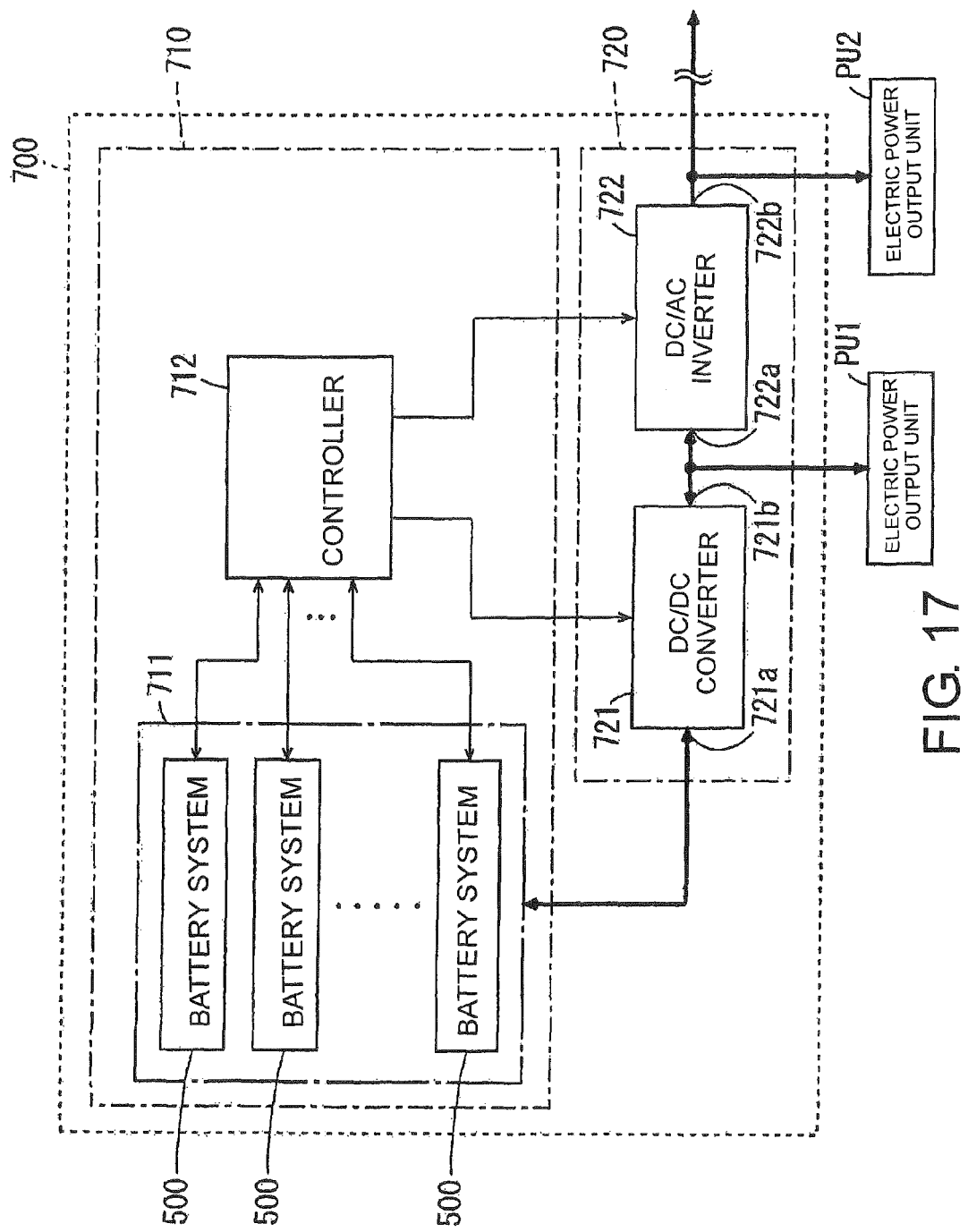
FIG. 17 is a block diagram showing a structure of a power supply device having a battery system.

FIG. 17 is a block diagram showing a structure of a power supply device having the battery system 500. As shown in FIG. 17, the power supply device 700 comprises an electricity storage device 710, and an electric power conversion device 720. The electricity storage device 710 comprises a group of battery systems 711 and a system controller 712. The group of battery systems 711 includes the battery systems 500 according to any of the first through fourth preferred embodiments of the present invention. Among the plurality of battery systems 500, a plurality of battery cells 10 may be connected in parallel to each other or in series to each other.

The system controller 712 is an example of a system controlling unit, and is formed with, for example, a CPU and a memory, or a microcomputer. The system controller 712 is connected to the calculation processor 300 (refer to FIG. 1) of each battery system 500. The calculation processor 300 of each battery system 500 calculates the state of charge of each battery cell 10 (refer to FIG. 1), and supplies the calculated state of charge to the system controller 712. The system controller 712 controls the electric power conversion device 720 based on the state of charge of each battery cell 10 supplied from each calculation processor 300, to apply a control related to charging or discharging of the plurality of battery cells 10 included in each battery system 500.

The electric power conversion device 720 comprises a DC/DC (direct current-to-direct current) converter 721 and a DC/AC (direct current-to-alternating current) inverter 722. The DC/DC converter 721 has input/output terminals 721a and 721b, and the DC/AC inverter 722 has input/output terminals 722a and 722b. The input/output terminal 721a of the DC/DC converter 721 is connected to the group of battery systems 711 of the electricity storage device 710. The input/output terminal 721b of the DC/DC converter 721 and the input/output terminal 722a of the DC/AC inverter 722 are connected to each other, and also to an electric power output unit PU1. The input/output terminal 722b of the DC/AC inverter 722 is connected to an electric power output unit PU2 and also to other electric power systems. The electric power output units PU1 and PU2 include, for example, a socket outlet. For example, various loads are connected to the electric power output units PU1 and PU2. The other electric power systems include, for example, a commercial power supply and a solar cell. The electric power output units PU1 and PU2 and the other electric power systems are examples of outside units connected to the power supply device.

The DC/DC converter 721 and the DC/AC inverter 722 are controlled by the system controller 712, so that the plurality of battery cells 10 included in the group of battery cells 711 are discharged or charged.

During the discharge of the group of battery systems 711, the electric power supplied from the group of battery systems 711 is DC/DC (direct current-to-direct current) converted by the DC/DC converter 721, and is also DC/AC (direct current-to-alternating current) converted by the DC/AC inverter 722.

The electric power which is DC/DC converted by the DC/DC converter 721 is supplied to the electric power output unit PU1. The electric power which is DC/AC converted by the DC/AC inverter 722 is supplied to the electric power output unit PU2. A direct current electric power is output from the electric power output unit PU1 to the outside, and an alternating current electric power is output from the electric power output unit PU2 to the outside. Alternatively, the electric power converted into the alternating current by the DC/AC inverter 722 may be supplied to other electric power systems.

The system controller 712 executes the following control as an example of a control related to the discharge of the plurality of battery cells 10 included in each battery system 500. During the discharge of the group of battery systems 711, the system controller 712 determines whether or not the discharge is to be stopped based on the state of charge of each battery cell 10 supplied from each calculation processor 300 (refer to FIG. 1), and controls the electric power conversion device 720 based on the determination result. Specifically, when the state of charge of any one battery cell 10 of the plurality of battery cells 10 (refer to FIG. 1) included in the group of battery systems 711 becomes lower than a threshold which is defined in advance, the system controller 712 controls the DC/DC converter 721 and the DC/AC inverter 722 so that the discharge is stopped or the discharge current (or discharge electric power) is restricted. With this configuration, excessive discharge of each battery cell 10 is prevented.

On the other hand, during the charging of the group of battery systems 711, an alternating current electric power supplied from the other electric power systems is AC/DC (alternating current-to-direct current) converted by the DC/AC inverter 722, and is further DC/DC (direct current-to-direct current) converted by the DC/DC converter 721. An electric power is supplied from the DC/DC converter 721 to the group of battery systems 711, and the plurality of battery cells 10 (refer to FIG. 1) included in the group of battery systems 711 are charged.

The system controller 712 applies the following control as an example of a control related to charging of the plurality of battery cells 10 included in each battery system 500. During the charging of the group of battery systems 711, the system controller 712 determines whether or not the charging is to be stopped based on a state of charge of each battery cell 10 supplied from each calculation processor 300 (refer to FIG. 1), and controls the electric power conversion device 720 based on the determination result. Specifically, when the state of charge of any one battery cell 10 of the plurality of battery cells 10 included in the group of battery systems 711 becomes greater than a threshold which is defined in advance, the system controller 712 controls the DC/Dc converter 721 and the DC/AC inverter 722 so that charging is stopped or the charging current (or charging electric power) is restricted. With this configuration, excessive charging of each battery cell 10 is prevented.

(2) Advantages

The electricity storage device 710 according to the present embodiment comprises the above-described battery system 500, and the system controller 712 which is a system controlling unit that applies a control related to charging or discharging of the battery cell 10 of the battery system 500.

In the electricity storage device 710, the system controller 712 applies the control related to charging or discharging of the battery cell 10 of the battery system 500. With this configuration, the system controller 712 can prevent degradation of the battery cell 10, and excessive discharge and excessive charge of the battery cell 10.

Because the above-described battery system 500 is used in the electricity storage device 710, the state of charge of the battery cell can be precisely calculated.

In addition, the power supply device 700 according to the present embodiment can be connected to the outside, and comprises the electricity storage device 710, and the electric power conversion device 720 which is controlled by the system controller 712 of the electricity storage device 710 and which executes electric power conversion between the battery cell 10 of the battery system 500 of the electricity storage device 710 and the outside.

In the power supply device 700, the electric power conversion device 720 applies the electric power conversion between the battery cell 10 of the battery system 500 and the outside. The system controller 712 of the electricity storage device 710 controls the electric power conversion device 720, to apply a control related to charging or discharging of the battery cell 10. With this configuration, the system controller 712 can prevent degradation of the battery cell 10, and excessive discharge and excessive charge of the battery cell 10.

Because the above-described battery system 500 is used in the power supply device 700, the state of charge of the battery cell 10 can be precisely calculated.

(3) Alternative Configuration of Power Supply Device

In the power supply device 700 of FIG. 17, in place of the calculation processor 300 being provided in each battery system 500, an alternative configuration may be employed in which the system controller 712 has functions similar to those of the calculation processor 300.

When the electric power can be supplied to and from each other between the power supply device 700 and the outside, an alternative configuration may be employed in which the electric power conversion device 720 only has one of the DC/DC converter 721 and the DC/AC inverter 722. When the electric power can be supplied to and from each other between the power supply device 700 and the outside, an alternative configuration may be employed in which the electric power conversion device 720 is omitted.

In the power supply device 700 of FIG. 17, a plurality of battery systems 500 are provided, but the present invention is not limited to such a configuration, and an alternative configuration may be employed in which only one battery system 500 is provided.

[7] Other Preferred Embodiments

In the first through fourth preferred embodiments of the present invention, the SOC is used as the state of charge, but the present invention is not limited to such a configuration. Alternatively, as the state of charge, in place of the SOC, the open circuit voltage, the remaining capacity, the depth of discharge, the current integrated value, the accumulated amount difference, or the like may be employed.

[8] Correspondence Between Constituting Elements in Claims and Units of Preferred Embodiments An example correspondence of the constituting elements in claims and the units of the preferred embodiment will be described below, but the present invention is not limited to the following example configuration.

The battery cell 10 is an example of the battery cell, and the calculation processor 300 is an example of the state-of-charge calculation unit and the state-of-charge calculation device. The current-based SOC calculation unit 310 is an example of the first and third state-of-charge calculation units, the voltage-based SOC calculation unit 320 is an example of the second and fourth state-of-charge calculation units, and the combined SOC calculation unit 330 is an example of the combining unit and the output state-of-charge calculation unit. The SOC is an example of the state of charge, the SOCi is an example of the first state of charge, the SOCv is an example of the second state of charge, the SOCi2 is an example of the third state of charge, and the SOCv2 is an example of the fourth state of charge. The combined SOCt is an example of the combined state of charge, and the display SOCd is an example of an output state of charge. The weight coefficient $(1-\alpha)$ is an example of the first weight coefficient, the weight coefficient $\alpha$ is an example of the second weight coefficient, the weight coefficient $(1-\kappa 1)$ is an example of the third weight coefficient, and the weight coefficient $\kappa 1$ is an example of the fourth weight coefficient. The transfer period t1 is an example of the transfer period, the output unit 140 is an example of the output unit, and the battery system 500 is an example of the battery system.

The motor 602 is an example of the motor and the external device, the drive wheel 603 is an example of the drive wheel, and the electricity-driven automobile 600 is an example of the electric vehicle. The vehicle body 610, ship body of the ship, airplane body of the airplane, car of the elevator, or body of the walking robot is an example of the movable structure body, the motor 602, drive wheel 603, screw, propeller, winding motor for elevating/lowering rope, or leg of the walking robot is an example of the motive power source. The electricity-driven automobile 600, ship, airplane, elevator, or walking robot is an example of the movable structure. The system controller 712 is an example of the system controlling unit, the electricity storage device 710 is an example of the electricity storage device, the power supply device 700 is an example of the power supply device, and the electric power conversion unit 720 is an example of the electric power conversion device.

As the constituting elements in the claims, various other elements having the structure or function described in the claims may alternatively be used.

The invention claimed is:

1. A battery system comprising:
  a battery cell; and
  a state-of-charge calculation unit that calculates a state of charge of the battery cell, wherein
  the state-of-charge calculation unit comprises:
    a first state-of-charge calculation unit that calculates a state of charge of the battery cell based on a current flowing in the battery cell as a first state of charge;
    a second state-of-charge calculation unit that calculates a state of charge of the battery cell based on a terminal voltage of the battery cell as a second state of charge; and
    a combining unit that weights the first state of charge calculated by the first state-of-charge calculation unit and the second state of charge calculated by the second state-of-charge calculation unit with a first weight coefficient and a second weight coefficient, respectively, and that combines the weighted first state of charge and the weighted second state of charge to calculate a combined state of charge,
  wherein the combining unit determines the first weight coefficient and the second weight coefficient based on whether the battery cell is in a charging state, a discharging state, or a charge/discharge stopped state; and
  the combining unit increases the second weight coefficient from a value less than the first weight coefficient to a value greater than the first weight coefficient in a transfer period having a length less than or equal to a transition period which is a period from a time when charging or discharging of the battery cell is stopped to a time when a steady state is reached.

2. The battery system according to claim 1, wherein the combining unit determines the first weight coefficient and the second weight coefficient based on at least one of a temperature of the battery cell, the current flowing in the battery cell, and a combined state of charge which is preciously calculated.

3. The battery system according to claim 1, wherein the combining unit continuously changes, with elapse of time, the first weight coefficient and the second weight coefficient at a switching between the charging state, the discharging state, and the charge/discharge stopped state toward determined values.

4. The battery cell according to claim 1, further comprising:
  an output unit that outputs at least one of the first weight coefficient, the second weight coefficient, and the combined state of charge calculated by the combining unit.

5. An electric vehicle comprising:
  the battery system according to claim 1;
  a motor that is driven by an electric power from the battery cell of the battery system; and
  a drive wheel that is rotated by a rotational power of the motor.

6. A movable structure comprising:
  the battery system according to claim 1;
  a movable structure body;
  a motive power source that converts an electric power from the battery cell of the battery system into a motive power for moving the movable structure body; and
  a drive unit that moves the movable structure body by the motive power converted by the motive power conversion unit.

7. An electricity storage device comprising:
  the battery system according to claim 1; and
  a system controlling unit that applies a control related to charging or discharging of the battery cell of the battery system.

8. A power supply device connectable to outside, the power supply device comprising:
  electricity storage device according to claim 7; and
  an electric power conversion device that is controlled by the system controlling unit of the electricity storage device, and that applies an electric power conversion between the battery cell of the battery system of the electricity storage device and the outside.

9. A battery system comprising:
  a battery cell; and
  a state-of-charge calculation unit that calculates a state of charge of the battery cell, wherein
  the state-of-charge calculation unit comprises:
    a first state-of-charge calculation unit that calculates a state of charge of the battery cell based on a current flowing in the battery cell as a first state of charge;
    a second state-of-charge calculation unit that calculates a state of charge of the battery cell based on a terminal voltage of the battery cell as a second state of charge; and
    a combining unit that weights the first state of charge calculated by the first state-of-charge calculation unit and the second state of charge calculated by the second state-of-charge calculation unit with a first weight coefficient and a second weight coefficient, respectively, and that combines the weighted first state of charge and the weighted second state of charge to calculate a combined state of charge,
  wherein the combining unit determines the first weight coefficient and the second weight coefficient based on whether the battery cell is in a charging state, a discharging state, or a charge/discharge stopped state; and
  the state-of-charge calculation unit further comprises:
    a third state-of-charge calculation unit that calculates a state of charge of the battery cell based on a current flowing in the battery cell as a third state of charge;
    a fourth state-of-charge calculation unit that calculates a state of charge of the battery cell based on a terminal voltage of the battery cell as a fourth state of charge; and
    an output state-of-charge calculation unit that weights the third state of charge calculated by the third state-of-charge calculation unit and the fourth state of charge calculated by the fourth state-of-charge calculation unit with a third weight coefficient and a fourth weight coefficient, respectively, and that combines the weighted third state of charge and the weighted fourth state of charge to calculate an output state of charge, and
    the output state-of-charge calculation unit continuously changes at least one of the third state of charge calculated by the third state-of-charge calculation unit and the fourth state of charge calculated by the fourth state-of-charge calculation unit so that the output state of charge becomes a lower limit value when the terminal voltage of the battery cell reaches a discharge termination voltage and becomes an upper limit value when the terminal voltage of the battery cell reaches a charge termination voltage.

\* \* \* \* \*